(12) United States Patent
Kato et al.

(10) Patent No.: US 12,069,880 B2
(45) Date of Patent: Aug. 20, 2024

(54) LIGHT EMITTING ELEMENT, METHOD FOR MANUFACTURING THE SAME, AND DISPLAY DEVICE

(71) Applicant: Sony Group Corporation, Tokyo (JP)

(72) Inventors: Takayoshi Kato, Kanagawa (JP); Naoya Kasahara, Kanagawa (JP); Shimpei Tsujikawa, Tokyo (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/348,815

(22) Filed: Jul. 7, 2023

(65) Prior Publication Data
US 2024/0057370 A1 Feb. 15, 2024

Related U.S. Application Data

(63) Continuation of application No. 17/313,294, filed on May 6, 2021, now Pat. No. 11,765,923, which is a (Continued)

(30) Foreign Application Priority Data

Aug. 7, 2015 (JP) .................................. 2015-157025

(51) Int. Cl.
*H10K 50/805* (2023.01)
*H05B 33/24* (2006.01)
(Continued)

(52) U.S. Cl.
CPC .......... *H10K 50/805* (2023.02); *H05B 33/24* (2013.01); *H10K 50/852* (2023.02);
(Continued)

(58) Field of Classification Search
None
See application file for complete search history.

(56) References Cited

U.S. PATENT DOCUMENTS 7,956,537 B2  6/2011  Nakadaira
2010/0060148 A1  3/2010  Hwang et al.
(Continued)

FOREIGN PATENT DOCUMENTS

CN  100380562 C  9/2008
JP  2004-022541 A  1/2004
(Continued)

*Primary Examiner* — Ashok Patel
(74) *Attorney, Agent, or Firm* — Michael Best & Friedrich LLP

(57) ABSTRACT

A light emitting element, display device, and method of manufacture of the same are disclosed. In one example, a light emitting element includes a lower layer/interlayer insulation layer; a light reflection layer formed on the lower layer/interlayer insulation layer; an upper layer/interlayer insulation layer; a first electrode formed on the upper layer/interlayer insulation layer; an insulation film formed at least on a region of the upper layer/interlayer insulation layer where the first electrode is not formed; an organic layer formed over the insulation film from above the first electrode, the organic layer having a light emitting layer including an organic light emitting material; and a second electrode formed on the organic layer. A groove is formed in a portion of the upper layer/interlayer insulation layer located in an edge region of the light emitting element, and an upper portion of the groove is closed with the insulation film.

12 Claims, 13 Drawing Sheets

Related U.S. Application Data continuation of application No. 16/397,507, filed on Apr. 29, 2019, now Pat. No. 11,024,823, which is a continuation of application No. 15/749,212, filed as application No. PCT/JP2016/068842 on Jun. 24, 2016, now Pat. No. 10,326,096.

(51) Int. Cl.
  *H10K 50/852* (2023.01)
  *H10K 50/856* (2023.01)
  *H10K 59/124* (2023.01)
  *H10K 59/35* (2023.01)

(52) U.S. Cl.
  CPC ......... *H10K 50/856* (2023.02); *H10K 59/124* (2023.02); *H10K 59/35* (2023.02)

(56) References Cited

U.S. PATENT DOCUMENTS

| | | |
|---|---|---|
| 2011/0198630 A1 | 8/2011 | Sumita et al. |
| 2013/0021556 A1 | 1/2013 | Nagato et al. |

FOREIGN PATENT DOCUMENTS

| | | |
|---|---|---|
| JP | 2004-253389 A | 9/2004 |
| JP | 2006-339028 A | 12/2006 |
| JP | 2009-091223 A | 4/2009 |
| JP | 2009-104859 A | 5/2009 |
| JP | 2012-064387 A | 3/2012 |

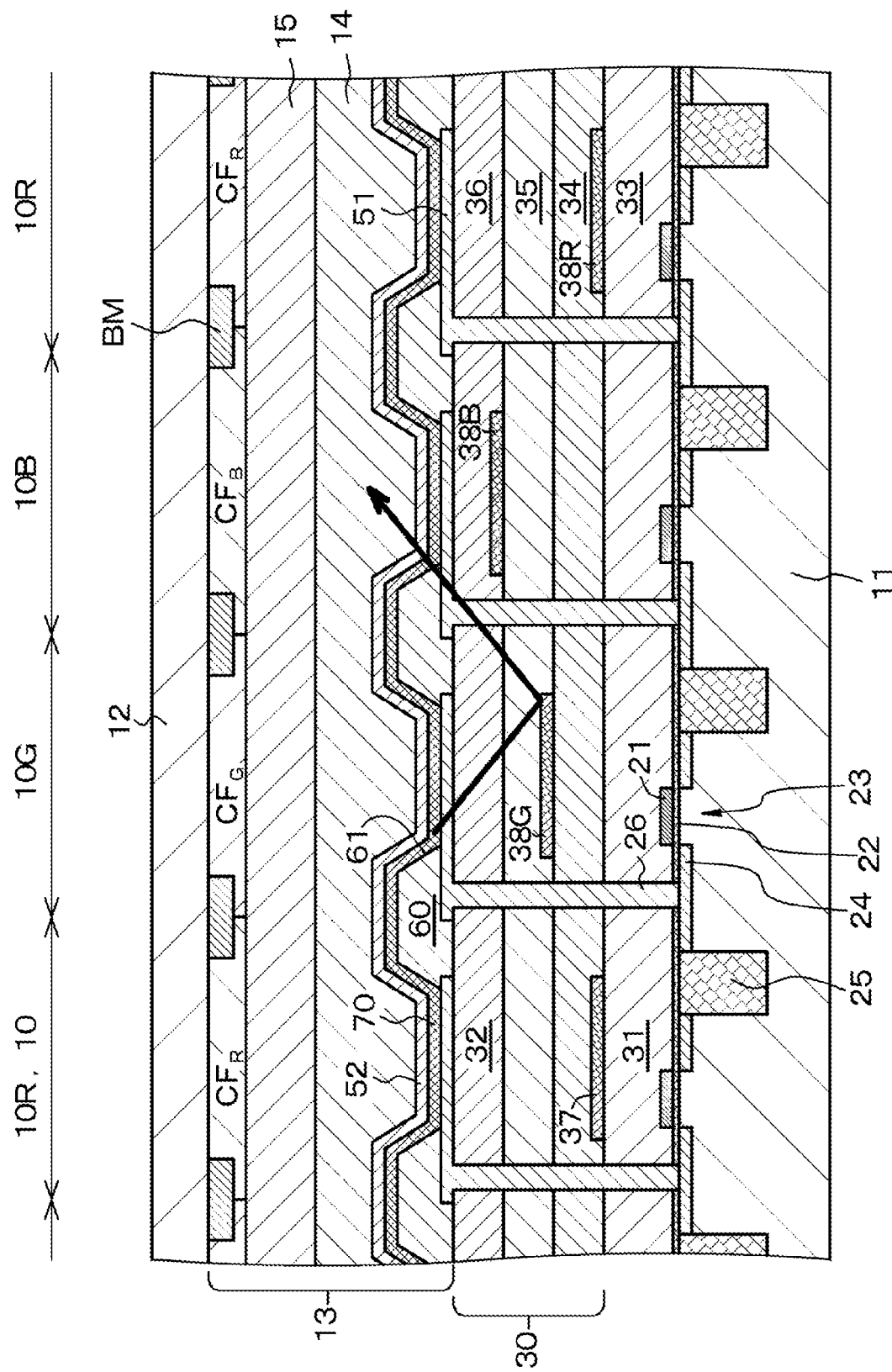

LIGHT EMITTING ELEMENT, METHOD FOR MANUFACTURING THE SAME, AND DISPLAY DEVICE

CROSS REFERENCES TO RELATED APPLICATIONS

This application is a Continuation Application of patent application Ser. No. 17/313,294, filed May 6, 2021, which is a Continuation Application of patent application Ser. No. 16/397,507, filed Apr. 29, 2019, now patent Ser. No. 11/024,823, issued on Jun. 1, 2021, which is a Continuation Application of patent application Ser. No. 15/749,212, filed Jan. 31, 2018, now U.S. Pat. No. 10,326,096, issued on Jun. 18, 2019, which is a National Stage Entry of Application No.: PCT/JP2016/068842, filed Jun. 24, 2016, which claims priority to Japanese Patent Application No.: 2015-157025, filed with Japan Patent Office on Aug. 7, 2015 and, the entire contents of which being incorporated herein by reference.

TECHNICAL FIELD

The present disclosure relates to a light emitting element, a method for manufacturing the light emitting element, and a display device.

BACKGROUND ART

In recent years, as a display device substituted for a liquid crystal display device, an organic electroluminescence display element (hereinafter, also simply abbreviated as an "organic EL display element") using an organic electroluminescence element (hereinafter, also simply abbreviated as an "organic EL element") has attracted attention. The organic EL display device is a self-luminous type, has a characteristic of low power consumption, and is considered to have sufficient responsiveness even to a high-definition high-speed video signal. Development and commercialization of the organic EL display device for practical use are keenly proceeding.

In the organic EL display device, high contrast and high color reproducibility can be realized, for example, by constituting one pixel with three sub-pixels (light emitting elements) constituted by a sub-pixel having a red light emitting layer and constituted by a light emitting element that emits red light, a sub-pixel having a green light emitting layer and constituted by a light emitting element that emits green light, and a sub-pixel having a blue light emitting layer and constituted by a light emitting element that emits blue light. Meanwhile, reduction of a pixel pitch is required for high resolution. However, it becomes more difficult to constitute one pixel with such three sub-pixels as the pixel pitch becomes finer.

Therefore, development of a method for forming a white light emitting layer over all pixels and coloring white light using a color filter, that is, development of technology for constituting one pixel with three sub-pixels (light emitting elements) of a red sub-pixel (referred to as a "red light emitting element") obtained by combining a light emitting element having a white light emitting layer (referred to as a "white light emitting element") and a red color filter, a green sub-pixel (referred to as a "green light emitting element") obtained by combining a white light emitting element and a green color filter, and a blue sub-pixel (referred to as a "blue light emitting element") obtained by combining a white light emitting element and a blue color filter is proceeding. The white light emitting layer is formed as a continuous layer over the entire white light emitting element. It is unnecessary to form the red light emitting layer, the green light emitting layer, and the blue light emitting layer for each sub-pixel. Therefore, the pixel pitch can be fine. In each of the white light emitting elements, the white light emitting layer is formed between a first electrode and a second electrode. The first electrode is formed independently in each of the light emitting elements. Meanwhile, the second electrode is common in each of the light emitting elements.

As technology for improving a light extraction efficiency in a pixel having such a configuration, there is technology for amplifying light emitted from each of light emitting elements by optimizing a cavity structure in each of the red light emitting element, the green light emitting element, and the blue light emitting element. Specifically, for example, as disclosed in Japanese Patent Application Laid-Open No. 2009-091223, a light reflection layer is formed below a first electrode including a transparent electrode, and a second electrode including a semi-light transmitting material and the light reflection layer constitute a resonator structure. In addition, light emitted from a light emitting layer is resonated between the light reflection layer and the second electrode, and a part of the light is emitted from the second electrode.

CITATION LIST

Patent Document

Patent Document 1: Japanese Patent Application Laid-Open No. 2009-091223

SUMMARY OF THE INVENTION

Problems to be Solved by the Invention

By the way, light emitted from a light emitting layer is propagated in all directions. Therefore, as illustrated in a schematic partial cross-sectional view of FIG. 13, light emitted from a certain light emitting element (indicated by a thick solid line in FIG. 13) may enter a light emitting element adjacent to the certain light emitting element (referred to as "adjacent light emitting element" for convenience). Alternatively, multiple reflection occurs inside a display device, and light emitted from a certain light emitting element may enter an adjacent light emitting element. Note that refer to FIG. 1 for reference numerals in FIG. 13. As a result, the chromaticity of the entire pixels may be shifted from desired chromaticity.

Therefore, an object of the present disclosure is to provide a light emitting element having a configuration and a structure hardly causing entry of light into an adjacent light emitting element, a method for manufacturing the light emitting element, and a display device including the light emitting element having such a configuration and structure.

Solutions to Problems

A light emitting element of the present disclosure for achieving the above object is a light emitting element including:
  a lower layer/interlayer insulation layer;
  a light reflection layer formed on the lower layer/interlayer insulation layer;
  an upper layer/interlayer insulation layer covering the lower layer/interlayer insulation layer and the light reflection layer;

a first electrode formed on the upper layer/interlayer insulation layer;

an insulation film formed at least on a region of the upper layer/interlayer insulation layer where the first electrode is not formed;

an organic layer formed over the insulation film from above the first electrode, the organic layer having a light emitting layer including an organic light emitting material; and a second electrode formed on the organic layer, in which a groove is formed in a portion of the upper layer/interlayer insulation layer located in an edge region of the light emitting element, and an upper portion of the groove is closed with the insulation film.

A display device of the present disclosure for achieving the above object is a display device formed by arranging a plurality of pixels each constituted by a first light emitting element, a second light emitting element, and a third light emitting element in a two-dimensional matrix, in which the pixels have a laminated structure in which a lowermost layer/interlayer insulation layer, a first interlayer insulation layer, a second interlayer insulation layer, and an uppermost layer/interlayer insulation layer are sequentially laminated, each of the light emitting elements includes:

a first electrode formed on the uppermost layer/interlayer insulation layer;

an insulation film formed at least on a region of the uppermost layer/interlayer insulation layer where the first electrode is not formed;

an organic layer formed over the insulation film from above the first electrode, the organic layer having a light emitting layer including an organic light emitting material; and a second electrode formed on the organic layer, the first light emitting element includes a first light reflection layer formed between the lowermost layer/interlayer insulation layer and the first interlayer insulation layer, the second light emitting element includes a second light reflection layer formed between the first interlayer insulation layer and the second interlayer insulation layer, the third light emitting element includes a third light reflection layer formed between the second interlayer insulation layer and the uppermost layer/interlayer insulation layer, a groove is formed in a portion of the first interlayer insulation layer, the second interlayer insulation layer, and the uppermost layer/interlayer insulation layer located in a boundary region among the light emitting elements, and an upper portion of the groove is closed with the insulation film.

A method for manufacturing a light emitting element of the present disclosure for achieving the above object includes steps of:

sequentially forming a lower layer/interlayer insulation layer, a light reflection layer formed on the lower layer/interlayer insulation layer, and an upper layer/interlayer insulation layer covering the lower layer/interlayer insulation layer and the light reflection layer, and then forming a first electrode on the upper layer/interlayer insulation layer;

subsequently forming a groove in a portion of the upper layer/interlayer insulation layer located in an edge region of the light emitting element;

then forming an insulation film at least on a region of the upper layer/interlayer insulation layer where the first electrode is not formed so as to close an upper portion of the groove; and subsequently forming an organic layer having a light emitting layer including an organic light emitting material over the insulation film from above the first electrode, and forming a second electrode on the organic layer.

Effects of the Invention

In the light emitting element of the present disclosure or a light emitting element manufactured by the method for manufacturing a light emitting element of the present disclosure (hereinafter, these light emitting elements are collectively referred to as a "light emitting element of the present disclosure or the like" for convenience), a groove is formed in a portion of the upper layer/interlayer insulation layer located in an edge region of the light emitting element. Furthermore, in the display device of the present disclosure, a groove is formed in a portion of the first interlayer insulation layer, the second interlayer insulation layer, and the uppermost layer/interlayer insulation layer located in a boundary region among the light emitting elements. Therefore, a part of light emitted from the light emitting layer and propagated in all directions is totally reflected at an interface between the groove and the upper layer/interlayer insulation layer, or at an interface between the groove and each of the first interlayer insulation layer, the second interlayer insulation layer, and the uppermost layer/interlayer insulation layer. Therefore, a ratio of entry of light emitted from a certain light emitting element into an adjacent light emitting element can be reduced, and occurrence of a phenomenon that color mixing occurs and the chromaticity of the entire pixels is shifted from desired chromaticity can be suppressed. Furthermore, the upper portion of the groove is closed with the insulation film. Therefore, no defect is generated in various layers or films formed above the groove. Note that effects described herein are merely illustrative, and are not restrictive. Furthermore, an additional effect may be present.

BRIEF DESCRIPTION OF DRAWINGS

FIG. 13 is a schematic partial cross-sectional view of a display device for explaining a problem of a conventional display device.

MODE FOR CARRYING OUT THE INVENTION

Figure 1:
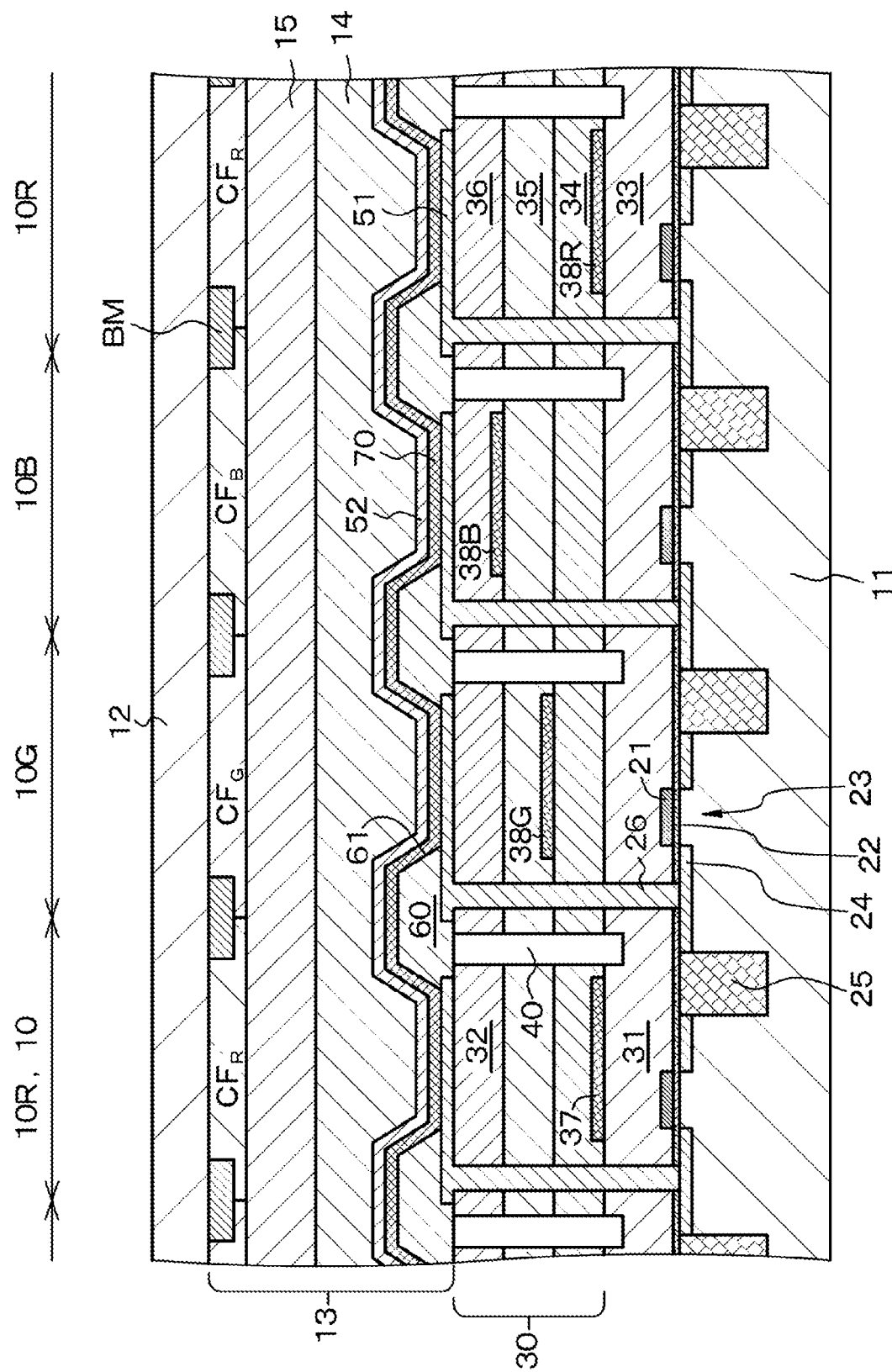
FIG. 1 is a schematic partial cross-sectional view of a display device of Example 1.

Hereinafter, the present disclosure will be described on the basis of Examples with reference to the drawings. However, the present disclosure is not limited to Examples, but various numerical values and materials in Examples are illustrative. Note that description will be made in the following order.

1. General description on light emitting element of the present disclosure, method for manufacturing the light emitting element, and display device of the present disclosure
2. Example 1 (light emitting element of the present disclosure, method for manufacturing the light emitting element, display device of the present disclosure, and light emitting element in first mode/light emitting element of first configuration)
3. Example 2 (modification of Example 1, light emitting element of configuration 1A)
4. Example 3 (another modification of Example 1, light emitting element of second configuration)
5. Example 4 (still another modification of Example 1, light emitting element in second mode, light emitting element in mode 2A)
6. Example 5 (modification of Example 4, light emitting element in mode 2B)
7. Example 6 (still another modification of Example 1, light emitting element in third mode)
8. Example 7 (modification of Examples 1 to 6)
9. Others <General Description on Light Emitting Element of the Present Disclosure, Method for Manufacturing the Light Emitting Element, and Display Device of the Present Disclosure>

In the following description, a laminated structure of a first interlayer insulation layer, a second interlayer insulation layer, and an uppermost layer/interlayer insulation layer may be referred to as a "interlayer insulation layer/laminated structure".

In the light emitting element of the present disclosure or the like, a portion of a groove where an upper portion is closed with an insulation film may be filled with air or in a vacuum state. Furthermore, in the display device of the present disclosure, in each of the light emitting elements, a portion of a groove where an upper portion is closed with an insulation film may be filled with air or in a vacuum state. The light emitting element in such a mode or a light emitting element in the display device in such a mode is referred to as a "light emitting element in a first mode" for convenience. Here, in the light emitting element in the first mode, when a refractive index of a material constituting an insulation film is represented by $n_{INS}$ and a refractive index of a material constituting an upper layer/interlayer insulation layer is represented by $n_{UP}$ (alternatively, when an average refractive index of an interlayer insulation layer/laminated structure is $n_{UP}$), $n_{UP} > n_{INS}$ may be satisfied. Specifically, although not limited, $0.5 \leq n_{UP} - n_{INS} \leq 1.0$ can be exemplified. Note that the refractive index $n_{UP}$ of the interlayer insulation layer/laminated structure is an average value of the refractive indices of a first interlayer insulation layer, a second interlayer insulation layer, and an uppermost layer/interlayer insulation layer constituting the interlayer insulation layer/laminated structure, and is obtained by summing up a product of the refractive index and the thickness of each of the interlayer insulation layers, and dividing the resulting sum by the thickness of the interlayer insulation layer/laminated structure.

Alternatively, in the light emitting element of the present disclosure or the like, the portion of the groove where an upper portion is closed with an insulation film may be filled with a material having a lower refractive index than a refractive index of a material constituting the upper layer/interlayer insulation layer.

Furthermore, in the display device of the present disclosure, in each of the light emitting elements, the portion of the groove where an upper portion is closed with an insulation film may be filled with a material having a lower refractive index than the refractive index of a material constituting the interlayer insulation layer/laminated structure. The light emitting element in such a mode or a light emitting element in the display device in such a mode is referred to as a "light emitting element in a second mode" for convenience. Here, in the light emitting element in the second mode, the insulation film may extend in the groove. Such a mode is referred to as a "light emitting element in a mode 2A" for convenience. That is, in the light emitting element in the mode 2A, a material with which the groove is filled and a material constituting the insulation film are the same as each other. Alternatively, the material with which the groove is filled and the material constituting the insulation film may be different from each other. Such a mode is referred to as a "light emitting element in a mode 2B" for convenience. In addition, in the light emitting element in the mode 2B, when a refractive index of a material constituting the insulation film is represented by $n_{INS}$, a refractive index of a material constituting the upper layer/interlayer insulation layer is represented by $n_{UP}$ (alternatively, an average refractive index of the interlayer insulation layer/laminated structure is $n_{UP}$), and a refractive index of a material with which the groove is filled is represented by $n_{SLIT}$, $n_{UP} > n_{SLIT}$ and $n_{UP} > n_{INS}$ may be satisfied. Specifically, although not limited, $1.0 \leq n_{UP} - n_{SLIT} \leq 1.7$ and
$0.5 \leq n_{UP} - n_{INS} \leq 1.0$ can be exemplified.

Alternatively, in the light emitting element of the present disclosure or the like, the portion of the groove where an upper portion is closed with an insulation film may be filled with a light shielding material. Furthermore, in the display device of the present disclosure, in each of the light emitting elements, the portion of the groove where an upper portion is closed with an insulation film may be filled with a light shielding material. The light emitting element in such a mode or a light emitting element in the display device in such a mode is referred to as a "light emitting element in a third mode" for convenience. Here, specific examples of the light shielding material include a material capable of shielding light, such as titanium (Ti), chromium (Cr), tungsten (W), tantalum (Ta), aluminum (Al), or $MoSi_2$.

In the light emitting element of the present disclosure or the like including the various preferable modes described above, the insulation film may extend to a top surface of an edge of the first electrode. In the display device of the present disclosure including the various preferable modes described above, in each of the light emitting elements, the insulation film may extend to a top surface of an edge of the first electrode. Note that the light emitting elements having these configurations are referred to as a "light emitting element of a first configuration" for convenience. In addition, in the light emitting element of the first configuration, the insulation film may have a two-layer structure of a first insulation film and a second insulation film, the first insulation film may be formed on a region of the upper layer/interlayer insulation layer (uppermost layer/interlayer insulation layer) where the first electrode is not formed, and the second insulation film may be formed over an edge of the first electrode from above the first insulation film. Note that the light emitting element having such a configuration is referred to as a "light emitting element of a configuration 1A" for convenience.

Alternatively, in the light emitting element of the present disclosure or the like including the various preferable modes described above, the insulation film may be formed on a region of the upper layer/interlayer insulation layer where the first electrode is not formed. In the display device of the present disclosure including the various preferable modes described above, in each of the light emitting elements, the insulation film may be formed on a region of the uppermost layer/interlayer insulation layer where the first electrode is not formed. Note that the light emitting elements having these configurations are referred to as a "light emitting element of a second configuration" for convenience.

Furthermore, in the light emitting element of the present disclosure or the like including the various preferable modes and configurations described above, a tip of the groove may extend to the lower layer/interlayer insulation layer (more specifically, to the middle of the lower layer/interlayer insulation layer). In the display device of the present disclosure including the various preferable modes and configurations described above, in each of the light emitting elements, a tip of the groove may extend to the lowermost layer/interlayer insulation layer (more specifically, to the middle of the lowermost layer/interlayer insulation layer).

The display device of the present disclosure including the various preferable modes described above may be constituted by an organic electroluminescence display element (organic EL display element). The light emitting element of the present disclosure or the like including the various preferable modes and configurations described above may be constituted by an organic electroluminescence element (organic EL element) In addition, the lowermost layer/interlayer insulation layer, the interlayer insulation layer/laminated structure, the organic layer, and the second electrode may be common in the plurality of light emitting elements.

Furthermore, in the light emitting element of the present disclosure or the like including the various preferable modes and configurations described above and a light emitting element in the display device of the present disclosure including the various preferable modes and configurations described above (hereinafter, these may be collectively referred to as a "light emitting element in the present disclosure or the like"), the groove may be formed so as to surround the light emitting element. Examples of a method for forming the groove include an etching method such as a dry etching method (specifically, for example, a RIE method) or a wet etching method.

In the light emitting element in the present disclosure or the like, the light emitting layer may be constituted by at least two light emitting layers that emit different colors. In this case, light emitted from the organic layer may be white. Specifically, the light emitting layer may have a structure obtained by laminating three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm), and emits white light as a whole. Alternatively, the light emitting layer may have a structure obtained by laminating two layers of a blue light emitting layer that emits blue light and a yellow light emitting layer that emits yellow light, and emits white light as a whole. Alternatively, the light emitting layer may have a structure obtained by laminating two layers of a blue light emitting layer that emits blue light and an orange light emitting layer that emits orange light, and emits white light as a whole. In addition, such a white light emitting element that emits white light includes a red color filter to constitute a red light emitting element. The white light emitting element includes a green color filter to constitute a green light emitting element. The white light emitting element includes a blue color filter to constitute a blue light emitting element. In addition, one pixel is constituted by a red light emitting element, a green light emitting element, and a blue light emitting element. In some cases, one pixel may be constituted by a red light emitting element, a green light emitting element, a blue light emitting element, and a light emitting element that emits white light (or a light emitting element that emits complementary color light). Note that, in a mode constituted by at least two light emitting layers that emit light of different colors, there is actually a case where the light emitting layers that emit light of different colors are mixed and are not clearly separated into the layers.

The color filter is constituted by a resin to which a coloring agent containing a desired pigment or dye is added. By selecting a pigment or a dye, adjustment is performed such that light transmittance in a target wavelength range of red, green, blue, or the like is high, and light transmittance in the other wavelength ranges is low. In a light emitting element that emits white light, it is only required to dispose a transparent filter. A black matrix layer (light shielding layer) may be formed between a color filter and a color filter. For example, the black matrix layer is constituted by a black resin film (specifically, including a black polyimide resin, for example) having an optical density of 1 or more, mixed with a black coloring agent, or a thin film filter using interference of a thin film. The thin film filter is formed by laminating two or more thin films including metal, metal nitride, or metal oxide, for example, and attenuates light by utilizing interference of a thin film. Specific examples of the thin film filter include a thin film filter obtained by alternately laminating Cr and chromium(III) oxide ($Cr_2O_3$).

Although not limited, a transistor (specifically, for example, a MOSFET) formed on a silicon semiconductor substrate may be disposed below the lower layer/interlayer insulation layer (lowermost layer/interlayer insulation layer), and the transistor formed on the silicon semiconductor substrate may be connected to the first electrode via a contact hole (contact plug) formed in the lower layer/interlayer insulation layer and the upper layer/interlayer insulation layer or the lowermost layer/interlayer insulation layer and the interlayer insulation layer/laminated structure. Alternatively, TFTs disposed on various substrates may be disposed below the lower layer/interlayer insulation layer (lowermost layer/interlayer insulation layer). In this way, the first electrode is disposed on the upper layer/interlayer insulation layer or the interlayer insulation layer/laminated structure, as described above. In addition, the lower layer/interlayer insulation layer or the lowermost layer/interlayer insulation layer covers a light emitting element driving unit formed on a first substrate. The light emitting element driving unit is constituted by one or more transistors (for example, MOSFETs or TFTs). The transistors are electrically connected to the first electrode via a contact hole disposed in the lower layer/interlayer insulation layer and the upper layer/interlayer insulation layer or the lowermost layer/interlayer insulation layer and the interlayer insulation layer/laminated structure, as described above. The light emitting element driving unit can have a known circuit configuration.

In another expression, the display device of the present disclosure includes a first substrate, a second substrate, and an image display unit sandwiched by the first substrate and the second substrate. In the image display unit, a plurality of the light emitting elements of the present disclosure including the preferable modes and configurations described above is arranged in a two-dimensional matrix. Herein, the light emitting elements are formed on a side of the first substrate.

In addition, the display device of the present disclosure is a top emission type display device that emits light from the second substrate. In the top emission type display device, it is only required to form a color filter and a black matrix layer on a surface side of the second substrate opposed to the first substrate. Alternatively, a color filter may be formed on a surface side of the first substrate opposed to the second substrate. That is, an on-chip color filter (OCCF) may be formed on the first substrate. In the display device of the present disclosure, in a case where one pixel (or sub-pixel) is constituted by one light emitting element, although not limited, examples of arrangement of pixels (or sub-pixels) include stripe arrangement, diagonal arrangement, delta arrangement, stripe arrangement, and rectangle arrangement.

In addition to the silicon semiconductor substrate, the first substrate or the second substrate may be constituted by a high strain point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates each having an insulation material layer formed on a surface thereof, a quartz substrate, a quartz substrate having an insulation material layer formed on a surface thereof, or an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, in the top emission type display device, the second substrate needs to be transparent to light emitted from the light emitting element.

In a case where the first electrode functions as an anode electrode, examples of a material constituting the first electrode include a transparent conductive material having excellent hole injection characteristics, such as oxide of indium and tin (ITO) or oxide of indium and zinc (IZO). The thickness of the first electrode may be 0.01 µm to 0.1 µm, for example.

Meanwhile, in a case where the second electrode functions as a cathode electrode, a material constituting the second electrode (a semi-light transmitting material or a light transmitting material) is desirably constituted by a conductive material having a small work function value so as to be able to transmit emitted light and inject an electron into an organic layer efficiently. Examples of the material constituting the second electrode include a metal having a small work function and an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium-calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=5:1 to 30:1, for example. Alternatively, as a volume ratio between magnesium and calcium may be Mg:Ca=2:1 to 10:1, for example. The thickness of the second electrode may be 4 nm to 50 nm, preferably 4 nm to 20 nm, and more preferably 6 nm to 12 nm, for example. Alternatively, the second electrode may have a laminated structure of the above material layer and a so-called transparent electrode (for example, thickness $3 \times 10^{-8}$ m to $1 \times 10^{-6}$ m) including, for example, ITO or IZO. A bus electrode (auxiliary electrode) including a low resistance material such as aluminum, an aluminum alloy, silver, a silver alloy, copper, a copper alloy, gold, or a gold alloy may be disposed in the second electrode to reduce resistance as the whole second electrode. Meanwhile, in a case where the second electrode functions as an anode electrode, the second electrode is desirably constituted by a conductive material that transmits emitted light and has a large work function value. Average light transmittance of the second electrode is 50% to 90%, and preferably 60% to 90%.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to various printing methods and a plating method, the first electrode or the second electrode having a desired shape (pattern) can be formed directly. Note that, in a case where the second electrode is formed after the organic layer is formed, the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. Furthermore, processes from formation of the organic layer to formation of these electrodes are preferably performed without exposure thereof to the atmosphere from a viewpoint of preventing deterioration of the organic layer due to moisture in the atmosphere. As described above, the second electrode is preferably a so-called common electrode without being patterned.

Examples of materials constituting the light reflection layer, the first light reflection layer, the second light reflection layer, and the third light reflection layer include aluminum, an aluminum alloy (for example, Al—Nd or Al—Cu), a Ti/Al laminated structure, chromium (Cr), silver (Ag), and a silver alloy (for example, Ag—Pd—Cu or Ag—Sm—Cu). The light reflection layer, the first light reflection layer, the second light reflection layer, and the third light reflection layer can be formed, for example, by a vapor deposition method including an electron beam vapor deposition method, a hot filament vapor deposition method, and a vacuum vapor deposition method, a sputtering method, a CVD method, or an ion plating method; a plating method (an electroplating method or an electroless plating method); a lift-off method; a laser ablation method; a sol-gel method, or the like.

The organic layer includes a light emitting layer including an organic light emitting material. Specifically, for example, the organic layer may be constituted by a laminated structure of a hole transport layer, a light emitting layer, and an electron transport layer, a laminated structure of a hole transport layer and a light emitting layer also serving as an electron transport layer, or a laminated structure of a hole injection layer, a hole transport layer, a light emitting layer, an electron transport layer, and an electron injection layer. Examples of a method for forming the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of a laser absorption layer and an organic layer formed on a transfer substrate with a laser and the organic layer is transferred; and various coating methods. In a case where the organic layer is formed on the basis of the vacuum vapor deposition method, for example, using a so-called metal mask, the organic layer can be obtained by depositing a material that has passed through an aperture disposed in the metal mask, or the organic layer may be formed on the entire surface without being patterned, as described above. In some cases, at least a part of a part of the organic layer (specifically, for example, a hole transport layer) may be discontinuous at an end of the insulation film.

An insulating or conductive protective film is preferably disposed above the second electrode in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent reduction in brightness due to deterioration of the organic layer, a film formation temperature is desirably set to room temperature. Furthermore, in order to prevent peeling of the protective film, the protective film is desirably formed under a condition minimizing a stress of the protective film. In addition, the protective film is preferably formed without exposure of an already formed electrode to the atmosphere. As a result, deterioration of the organic layer due to moisture or oxygen in the atmosphere can be prevented. Furthermore, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxide/nitride ($\alpha$-SiON), and Al$_2$O$_3$. In a case where the protective film is constituted by a conductive material, the protective film is only required to be constituted by a transparent conductive material such as ITO, IZO, or IGZO. The protective film and the second substrate are bonded to each other, for example, via a resin layer (sealing resin layer). Examples of a material constituting the resin layer (sealing resin layer) include a thermosetting adhesive such as an acrylic adhesive, an epoxy-based adhesive, a urethane-based adhesive, a silicone-based adhesive, or a cyanoacrylate-based adhesive, and an ultraviolet curable adhesive.

On an outermost surface of the display device, an ultraviolet absorbing layer, a contamination preventing layer, a hard coat layer, and an antistatic layer may be formed, or a protective member may be disposed.

In the light emitting element in the present disclosure or the like, examples of an insulating material constituting the lower layer/interlayer insulation layer, the upper layer/interlayer insulation layer, the lowermost layer/interlayer insulation layer, the interlayer insulation layer/laminated structure, or the insulation film include a SiO$_x$-based material (material constituting a silicon-based oxide film) such as SiO$_2$, non-doped silicate glass (NSG), borophosphosilicate glass (BPSG), PSG, BSG, AsSG, SbSG, PbSG, spin on glass (SOG), low temperature oxide (LTO, low temperature CVD-SiO$_2$), low melting point glass, or glass paste; a SiN-based material including a SiON-based material; SiOC; SiOF; and SiCN. Examples of the insulating material further include an inorganic insulating material such as titanium oxide (TiO$_2$), tantalum oxide (Ta$_2$O$_5$), aluminum oxide (Al$_2$O$_3$), magnesium oxide (MgO), chromium oxide (CrO$_x$), zirconium oxide (ZrO$_2$), niobium oxide (Nb$_2$O$_5$), tin oxide (SnO$_2$), or vanadium oxide (VO$_x$). Examples of the insulating material further include various resins such as a polyimide-based resin, an epoxy-based resin, and an acrylic resin; and a low dielectric constant insulating material such as SiOCH, organic SOG, or a fluorine-based resin (for example, a material having a dielectric constant k ($=\varepsilon/\varepsilon_0$) of 3.5 or less, for example, and specific examples thereof include fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, amorphous carbon, parylene (polyparaxylylene), and fluorinated fullerene). Examples of the insulating material further include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used singly or in appropriate combination thereof. The interlayer insulation layer or the insulation film can be formed by a known method such as various CVD methods, various coating methods, various PVD methods including a sputtering method and a vacuum vapor deposition method, various printing methods such as a screen printing method, a plating method, an electrodeposition method, an immersion method, or a sol-gel method. Table 1 below indicates relative dielectric constants of various insulating materials.

TABLE 1

| | |
|---|---|
| Silicon oxide (SiO$_2$) | 4 to 5 |
| Fluorine-containing silicon oxide (SiOF: FSG) | 3.4 to 3.6 |
| Silicon nitride (Si$_3$N$_4$) | about 6 |
| Borosilicate glass (SiO$_2$—B$_2$O$_3$ to SiOB: BSG) | 3.5 to 3.7 |
| Si—H-containing silicon oxide (HSQ) | 2.8 to 3.0 or <2.0 |
| Porous silica (silicon oxide containing carbon) | <3.0 |
| Carbon-containing silicon oxide (SiOC) | 2.7 to 2.9 |
| Methyl group-containing silicon oxide (MSQ) | 2.7 to 2.9 |
| Porous methyl group-containing silicon oxide (porous MSQ) | 2.4 to 2.7 |
| Fluororesin such as polytetrafluoroethylene | 2.0 to 2.4 |
| Polyimide | 3.0 to 3.5 |
| Polyaryl ether | about 2.8 |
| Parylene-based polymer | 2.7 to 3.0 |
| Amorphous carbon doped with fluorine | <2.5 |

Specifically, in the light emitting element in the present disclosure or the like including the various preferable modes and configurations described above, when a refractive index of a material constituting the lower layer/interlayer insulation layer (lowermost layer/interlayer insulation layer) is represented by $n_{DOWN}$, $|n_{DOWN}-n_{UP}|\leq1.3$ is preferably satisfied. More specifically, examples of a combination of (material constituting lower layer/interlayer insulation layer, material constituting upper layer/interlayer insulation layer) include (SiO$_2$, SiN), (SiO$_2$, SiON), (porous silica, SiN), (SiOF, SiN), (SiOC, SiN), (SiOF, SiO$_2$), and (SiOC, SiO$_2$).

Furthermore, in a case of the light emitting element of the configuration 1A having a two-layer structure of the first insulation film and the second insulation film, examples of a material constituting the first insulation film include SiN, SiO$_2$, and SiON, and examples of a material constituting the second insulation film include SiN, SiO$_2$, and SiON.

Meanwhile, in the light emitting element in the mode 2B in which the portion of the groove is filled with a material (hereinafter, referred to as a "low refractive index material") having a lower refractive index than the refractive index of a material constituting the upper layer/interlayer insulation layer, specific examples of the low refractive index material include polyimide, SiOC, and SiOF, and specific examples of the material constituting the upper layer/interlayer insulation layer include SiO$_2$ and SiON.

Furthermore, in the display device of the present disclosure, examples of a material constituting the first interlayer insulation layer include SiO$_2$ and SiON. Furthermore, examples of a material constituting the second interlayer insulation layer include SiO$_2$ and SiON.

In order to further improve a light extraction efficiency, the organic EL display device preferably has a resonator structure. Specifically, light emitted from the light emitting layer is caused to resonate between a first interface constituted by an interface between the light reflection layer disposed below the first electrode and the interlayer insulation layer located above the light reflection layer and a second interface constituted by an interface between the second electrode and the organic layer, and a part of the light is emitted from the second electrode. In addition, when a distance from a maximum emission position of the light emitting layer to the first interface is represented by $L_1$, an optical distance thereof is represented by $OL_1$, a distance from the maximum emission position of the light emitting layer to the second interface is represented by $L_2$, an optical distance thereof is represented by $OL_2$, and $m_1$ and $m_2$ each represent an integer, the following formulas (1-1), (1-2), (1-3), and (1-4) are satisfied.

$$0.7\{-\Phi_1/(2\pi)+m_1\}\leq 2\times OL_1/\lambda\leq 1.2\{-\Phi_1/(2\pi)+m_1\} \qquad (1\text{-}1)$$

$$0.7\{-\Phi_2/(2\pi)+m_2\}2\times OL_2/\lambda\leq 1.2\{-\Phi_2/(2\pi)+m_2\} \qquad (1\text{-}2)$$

$$L_1<L_2 \qquad (1\text{-}3)$$

$$m_1<m_2 \qquad (1\text{-}4)$$

Here, $\lambda$ represents a maximum peak wavelength of a spectrum of light generated in the light emitting layer (or desired wavelength of light generated in the light emitting layer), $\Phi_1$ represents a phase shift amount of light reflected on the first interface (unit: radian) in which $-2\pi<\Phi_1\leq 0$, and $\Phi_2$ represents a phase shift amount of light reflected on the second interface (unit: radian) in which $-2\pi<\Phi_2\leq 0$.

Note that the distance $L_1$ from the maximum emission position of the light emitting layer to the first interface means an actual distance (physical distance) from the maximum emission position of the light emitting layer to the first interface and the distance $L_2$ from the maximum emission position of the light emitting layer to the second interface means an actual distance (physical distance) from the maximum emission position of the light emitting layer to the second interface. In addition, the optical distance is also called an optical path length, and generally refers to n×L when a light ray passes through a medium having a refractive index n for a distance L. The same applies to the following description. Therefore, when an average refractive index is represented by $n_0$, the following relations are satisfied.

$OL_1=L_1\times n_0$ $OL_2=L_2\times n_0$ Here, the average refractive index $n_0$ is obtained by summing up a product of the refractive index and the thickness of each layer constituting the organic layer and the interlayer insulation layer, and dividing the resulting sum by the thickness of the organic layer and the interlayer insulation layer. In addition, the second electrode may be made by including a semi-light transmitting material and may have a form of $m_1=0$ and $m_2=1$ in which a light extraction efficiency can be maximized.

The light reflection layer and the second electrode absorb a part of incident light and reflect the rest. Therefore, a phase shift occurs in the reflected light. The phase shift amounts $\Phi_1$ and $\Phi_2$ can be determined by measuring values of a real number part and an imaginary number part of a complex refractive index of each of materials constituting the light reflection layer and the second electrode, for example, using an ellipsometer, and performing calculation based on these values (refer to, for example, "Principles of Optic", Max Born and Emil Wolf, 1974 (PERGAMON PRESS)). Note that a refractive index of the organic layer, the interlayer insulation layer, or the like can also be determined by measurement with an ellipsometer.

As described above, in an organic EL display device having a resonator structure, actually, a red light emitting element constituted by inclusion of a red color filter in a white light emitting element causes red light emitted from the light emitting layer to resonate, and emits reddish light (light having a light spectrum peak in a red region) from the second electrode. Furthermore, the green light emitting element constituted by inclusion of a green color filter in a white light emitting element causes green light emitted from the light emitting layer to resonate, and emits greenish light (light having a light spectrum peak in a green region) from the second electrode. Furthermore, the blue light emitting element constituted by inclusion of a blue color filter in a white light emitting element causes blue light emitted from the light emitting layer to resonate, and emits blueish light (light having a light spectrum peak in a blue region) from the second electrode. That is, it is only required to design each of the light emitting elements by determining a desired wavelength λ (specifically, wavelengths of red light, green light, and blue light) among wavelengths of light generated in the light emitting layer and determining various parameters such as $OL_1$ and $OL_2$ in each of the red light emitting element, the green light emitting element, and the blue light emitting element on the basis of formulas (1-2), (1-2), (1-3), and (1-4). For example, paragraph [0041] of Japanese Patent Application Laid-Open No. 2012-216495 discloses an organic EL element having a resonance structure, using a light emitting layer (organic layer) as a resonance part, and describes that the film thickness of the organic layer is preferably 80 nm or more and 500 nm or less, and more preferably 150 nm or more and 350 nm or less because a distance from a light emitting point to a reflection surface can be appropriately adjusted.

In an organic EL display device, the thickness of a hole transport layer (hole supply layer) and the thickness of an electron transport layer (electron supply layer) are desirably substantially equal to each other. Alternatively, the thickness of the electron transport layer (electron supply layer) may be larger than that of the hole transport layer (hole supply layer). As a result, an electron can be supplied sufficiently to the light emitting layer in an amount necessary for a high efficiency at a low driving voltage. That is, by disposing a hole transport layer between the first electrode corresponding to an anode electrode and the light emitting layer, and forming the hole transport layer with a film having a film thickness smaller than the electron transport layer, supply of holes can be increased. In addition, this makes it possible to obtain a carrier balance with no excess or deficiency of holes and electrons and a sufficiently large carrier supply amount. Therefore, a high emission efficiency can be obtained. Furthermore, due to no excess or deficiency of holes and electrons, the carrier balance hardly collapses, drive deterioration is suppressed, and an emission lifetime can be prolonged.

The display device can be used, for example, as a monitor device constituting a personal computer, or a monitor device incorporated in a television receiver, a mobile phone, a personal digital assistant (PDA), or a game machine. Alternatively, the display device can be applied to an electronic view finder (EVF) or a head mounted display (HMD). The head mounted display includes, for example, (a) a frame attached to the head of an observer and (b) an image display device attached to the frame. The image display device includes (A) the display device of the present disclosure and (B) an optical device on which light emitted from the display device of the present disclosure is incident and from which the light is emitted. The optical device includes (B-1) a light guide plate in which the light incident on the light guide plate from the display device of the present disclosure is propagated by total reflection and then from which the light is emitted toward an observer, (B-2) a first deflecting means (for example, including a volume hologram diffraction grating film) that deflects the light incident on the light guide plate such that the light incident on the light guide plate is totally reflected in the light guide plate, and (B-3) a second deflecting means (for example, including a volume hologram diffraction grating film) that deflects the light propagated in the light guide plate by total reflection a plurality of times in order to emit the light propagated in the light guide plate by total reflection from the light guide plate.

Example 1

Example 1 relates to the light emitting element of the present disclosure or the like and the display device of the present disclosure, and more specifically relates to the light emitting element in the first mode and the light emitting element of the first configuration. FIG. 1 illustrates a schematic partial cross-sectional view of the display device of the present disclosure. The display device of Example 1 includes specifically an organic EL display device. The light emitting element of Example 1 includes specifically an organic EL element.

A light emitting element 10 of Example 1 includes: a lower layer/interlayer insulation layer 31; a light reflection layer 37 formed on the lower layer/interlayer insulation layer 31; an upper layer/interlayer insulation layer 32 covering the lower layer/interlayer insulation layer 31 and the light reflection layer 37; a first electrode 51 formed on the upper layer/interlayer insulation layer 32; an insulation film 60 formed at least on a region of the upper layer/interlayer insulation layer 32 where the first electrode 51 is not formed; an organic layer 70 formed over the insulation film 60 from above the first electrode 51, the organic layer 70 having a light emitting layer including an organic light emitting material; and a second electrode 52 formed on the organic layer 70. In addition, a groove 40 is formed in a portion of the upper layer/interlayer insulation layer 32 located in an edge region of the light emitting element 10, and an upper portion of the groove 40 is closed with the insulation film 60.

Furthermore, the display device of Example 1 is a display device formed by arranging a plurality of pixels each constituted by a first light emitting element 10R, a second light emitting element 10G, and a third light emitting element 10B in a two-dimensional matrix. The pixels have a laminated structure in which a lowermost layer/interlayer insulation layer 33, a first interlayer insulation layer 34, a second interlayer insulation layer 35, and an uppermost layer/interlayer insulation layer 36 are sequentially laminated. In addition, each of the light emitting elements 10R, 10G, and 10B includes: the first electrode 51 formed on the uppermost layer/interlayer insulation layer 36; the insulation film 60 formed at least on a region of the uppermost layer/interlayer insulation layer 36 where the first electrode 51 is not formed; the organic layer 70 formed over the insulation film 60 from above the first electrode 51, the organic layer 70 having a light emitting layer including an organic light emitting material; and the second electrode 52 formed on the organic layer 70. The first light emitting element 10R includes a first light reflection layer 38R formed between the lowermost layer/interlayer insulation layer 33 and the first interlayer insulation layer 34. The second light emitting element 10G includes a second light reflection layer 38G formed between the first interlayer insulation layer 34 and the second interlayer insulation layer 35. The third light emitting element 10B includes a third light reflection layer 38B formed between the second interlayer insulation layer 35 and the uppermost layer/interlayer insulation layer 36.

In addition, the groove 40 is formed in a portion of the first interlayer insulation layer 34, the second interlayer insulation layer 35, and the uppermost layer/interlayer insulation layer 36 located in a boundary region among the light emitting element 10R, 10G, and 10B, and an upper portion of the groove 40 is closed with the insulation film 60. Note that the first interlayer insulation layer 34, the second interlayer insulation layer 35, and the uppermost layer/interlayer insulation layer 36 are collectively referred to as an interlayer insulation layer/laminated structure 30.

The first light emitting element (specifically, red light emitting element) 10R of the display device of Example 1 corresponds to the light emitting element 10 of Example 1 as follows. That is, the lower layer/interlayer insulation layer 31 in the light emitting element 10 corresponds to the lowermost layer/interlayer insulation layer 33 in the first light emitting element 10R. The upper layer/interlayer insulation layer 32 in the light emitting element 10 corresponds to the first interlayer insulation layer 34, the second interlayer insulation layer 35, and the uppermost layer/interlayer insulation layer 36 in the first light emitting element 10R. The light reflection layer 37 in the light emitting element 10 corresponds to the first light reflection layer 38R in the first light emitting element 10R.

Furthermore, the second light emitting element (specifically, green light emitting element) 10G of the display device of Example 1 corresponds to the light emitting element 10 of Example 1 as follows. That is, the lower layer/interlayer insulation layer 31 in the light emitting element 10 corresponds to the lowermost layer/interlayer insulation layer 33 and the first interlayer insulation layer 34 in the second light emitting element 10G. The upper layer/interlayer insulation layer 32 in the light emitting element 10 corresponds to the second interlayer insulation layer 35 and the uppermost layer/interlayer insulation layer 36 in the second light emitting element 10G. The light reflection layer 37 in the light emitting element 10 corresponds to the second light reflection layer 38G in the second light emitting element 10G.

Furthermore, the third light emitting element (specifically, blue light emitting element) 10B of the display device of Example 1 corresponds to the light emitting element 10 of Example 1 as follows. That is, the lower layer/interlayer insulation layer 31 in the light emitting element 10 corresponds to the lowermost layer/interlayer insulation layer 33, the first interlayer insulation layer 34, and the second interlayer insulation layer 35 in the third light emitting element 10B. The upper layer/interlayer insulation layer 32 in the light emitting element 10 corresponds to the uppermost layer/interlayer insulation layer 36 in the third light emitting element 10B. The light reflection layer 37 in the light emitting element 10 corresponds to the third light reflection layer 38B in the third light emitting element 10B.

Furthermore, in another expression, the display device of Example 1 includes a first substrate 11, a second substrate 12, and an image display unit 13 sandwiched by the first substrate 11 and the second substrate 12. In the image display unit 13, the plurality of light emitting elements 10 (10R, 10G, and 10B) of Example 1 is arranged in a two-dimensional matrix. Here, the light emitting elements are formed on a side of the first substrate 11. In addition, the display device of Example 1 is a top emission type display device that emits light from the second substrate 12. In the top emission type display device, color filters $CF_R$, $CF_G$, and $CF_B$, and a black matrix layer BM are formed on a surface side of the second substrate 12 opposed to the first substrate 11. One sub-pixel is constituted by one of the light emitting elements 10.

Here, a refractive index of a material constituting the insulation film 60 is represented by $n_{INS}$,
a refractive index of a material constituting the upper layer/interlayer insulation layer 32 or the average refractive index of the interlayer insulation layer/laminated structure 30 is represented by $n_{UP}$,
a refractive index of a material constituting the second interlayer insulation layer 35 is represented by $n_{IL-2}$,
a refractive index of a material constituting the first interlayer insulation layer 34 is represented by $n_{IL-1}$, and
a refractive index of a material constituting the lower layer/interlayer insulation layer 31 (lowermost layer/interlayer insulation layer 33) is represented by $n_{DOWN}$.

In addition, in the light emitting element 10 of Example 1, for example, the portion of the groove 40 where an upper portion is closed with the insulation film 60 is filled with air or in a vacuum state depending on film formation conditions of the insulation film 60. Here, $n_{UP} > n_{INS}$ is satisfied. Furthermore, $|n_{DOWN} - n_{IL-1}| \leq 0.5$, $|n_{IL-1} - n_{IL-2}| \leq 0.5$, and $|n_{IL-2} - n_{UP}| \leq 0.5$ are satisfied. The insulation film 60 extends to a top surface of an edge of the first electrode 51. Furthermore, a tip of the groove 40 extends to the lower layer/interlayer insulation layer 31 (more specifically, to the middle of the lower layer/interlayer insulation layer 31) or to the lowermost layer/interlayer insulation layer 33 (more specifically, to the middle of the lowermost layer/interlayer insulation layer 33). Furthermore, the lowermost layer/interlayer insulation layer 33, the interlayer insulation layer/laminated structure 30, the organic layer 70, and the second electrode 52 are common in the plurality of light emitting elements.

One pixel is constituted by three light emitting elements of the red light emitting element 10R, the green light emitting element 10G, and the blue light emitting element 10B. The second substrate 12 includes the color filters $CF_R$, $CF_G$, and $CF_B$. The organic EL element emits white light, and the light emitting elements 10R, 10G, and 10B are constituted by a combination of a white light emitting element that emits white light and the color filters $CF_R$, $CF_G$, and $CF_B$, respectively. That is, the light emitting layer emits white light as a whole. Furthermore, a light shielding film (black matrix layer BM) is disposed between a color filter and a color filter. The number of pixels is, for example, 1920×1080, one display element constitutes one sub-pixel, and the number of display elements (specifically, organic EL elements) is three times the number of pixels.

The first electrode 51 functions as an anode electrode, and the second electrode 52 functions as a cathode electrode. The first electrode 51 is made by including a transparent conductive material such as ITO having a thickness of 0.01 μm to 0.1 μm, and the second electrode 52 is made by including a Mg—Ag alloy having a thickness of 4 nm to 20 nm. The first electrode 51 is formed on the basis of a combination of a vacuum vapor deposition method and an etching method. Furthermore, a film of the second electrode 52 is formed by a film formation method in which energy of film formation particles is small, such as a vacuum vapor deposition method, and is not patterned. The organic layer 70 is not patterned, either. The light reflection layer 37 (first light reflection layer 38R, second light reflection layer 38G, and third light reflection layer 38B) has a laminated structure of titanium (Ti)/aluminum (Al). Furthermore, the first substrate 11 includes a silicon semiconductor substrate, and the second substrate 12 includes a glass substrate.

In Example 1, the organic layer 70 has a laminated structure of a hole injection layer (HIL), a hole transport layer (HTL), a light emitting layer, an electron transport layer (ETL), and an electron injection layer (EIL). The light emitting layer is constituted by at least two light emitting layers that emit different colors, and light emitted from the organic layer 70 is white. Specifically, the light emitting layer has a structure in which three layers of a red light emitting layer that emits red light, a green light emitting layer that emits green light, and a blue light emitting layer that emits blue light are laminated. The light emitting layer may have a structure in which two layers of a blue light emitting layer that emits blue light and a yellow light emitting layer that emits yellow light are laminated or a structure in which two layers of a blue light emitting layer that emits blue light and an orange light emitting layer that emits orange light are laminated. The red light emitting element 10R to display a red color includes the red color filter $CF_R$. The green light emitting element 10G to display a green color includes the green color filter $CF_G$. The blue light emitting element 10B to display a blue color includes the blue color filter $CF_B$. The red light emitting element 10R, the green light emitting element 10G, and the blue light emitting element 10B have the same configuration and structure except for the color filters and positions of the light reflection layer. The black matrix layer (light shielding layer) BM is formed between a color filter CF and a color filter CF. In addition, the color filter CF and the black matrix layer BM are formed on a surface side of the second substrate 12 opposed to the first substrate 11. This makes it possible to shorten a distance between the light emitting layer and the color filter CF and to suppress color mixing caused by incidence of light emitted from the light emitting layer on an adjacent color filter CF of another color.

The hole injection layer increases a hole injection efficiency, functions as a buffer layer for preventing leakage, and has a thickness of about 2 nm to 10 nm, for example. The hole injection layer is made by including a hexaazatriphenylene derivative represented by the following formula (A) or (B), for example.

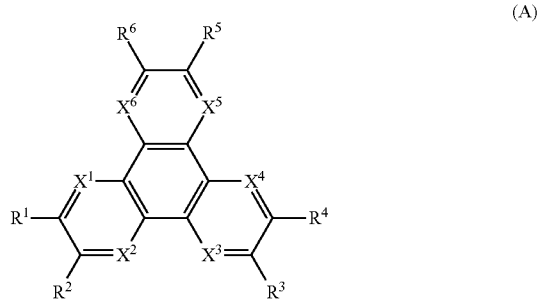

(A)

Herein, $R^1$ to $R^6$ each independently represent a substituent selected from a hydrogen atom, a halogen atom, a hydroxy group, an amino group, an arulamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having or less carbon atoms, a substituted or unsubstituted aryl group having 30 or less carbon atoms, a substituted or unsubstituted heterocyclic group having 30 or less carbon atoms, a nitrile group, a cyano group, a nitro group, and a silyl group, and adjacent $R^m$s (m=1 to 6) may be bonded to each other via a cyclic structure. In addition, $X^1$ to $X^6$ each independently represent a carbon atom or a nitrogen atom.

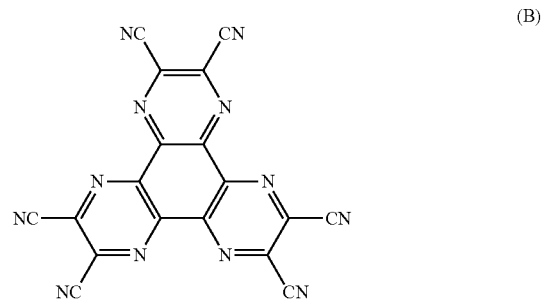 [SMILES: N#Cc1nc2c3nc(C#N)c(C#N)nc3c3nc(C#N)c(C#N)nc3c2nc1C#N]

(B)

The hole transport layer is a layer that increases a hole transport efficiency to the light emitting layer. When an electric field is applied to the light emitting layer, recombination of electrons and holes occurs to generate light. The electron transport layer is a layer that increases an electron transport efficiency to the light emitting layer, and the electron injection layer is a layer that increases an electron injection efficiency to the light emitting layer.

The hole transport layer is made by including 4,4',4"-tris (3-methylphenylphenylamino) triphenylamine <m-MT-DATA> or α-naphthylphenyl diamine <αNPD> having a thickness of about 40 nm, for example.

The light emitting layer generates white light by color mixing, and is formed by laminating a red light emitting layer, a green light emitting layer, and a blue light emitting layer as described above, for example.

In the red light emitting layer, by application of an electric field, a part of holes injected from the first electrode 51 and a part of electrons injected from the second electrode 52 are recombined to generate red light. Such a red light emitting layer contains at least one kind of material among a red light emitting material, a hole transport material, an electron transport material, and a both charge transport material, for example. The red light emitting material may be a fluorescent material or a phosphorescent material. The red light emitting layer having a thickness of about 5 nm is formed by mixing 30% by mass of 2,6-bis[(4'-methoxydiphenylamino) styryl]-1,5-dicyanonaphthalene <BSN> with 4,4-bis(2,2-diphenylvinin) biphenyl <DPVBi>, for example.

In the green light emitting layer, by application of an electric field, a part of holes injected from the first electrode 51 and a part of electrons injected from the second electrode 52 are recombined to generate green light. Such a green light emitting layer contains at least one kind of material among a green light emitting material, a hole transport material, an electron transport material, and a both charge transport material, for example. The green light emitting material may be a fluorescent material or a phosphorescent material. The green light emitting layer having a thickness of about 10 nm is formed by mixing 5% by mass of coumarin 6 with DPVBi, for example.

In the blue light emitting layer, by application of an electric field, a part of holes injected from the first electrode 51 and a part of electrons injected from the second electrode 52 are recombined to generate blue light. Such a blue light emitting layer contains at least one kind of material among a blue light emitting material, a hole transport material, an electron transport material, and a both charge transport material, for example. The blue light emitting material may be a fluorescent material or a phosphorescent material. The blue light emitting layer having a thickness of about 30 nm is formed by mixing 2.5% by mass of 4,4'-bis [2-{4-(N,N-diphenylamino) phenyl} vinyl] biphenyl <DPAVBi> with DPVBi, for example.

The electron transport layer having a thickness of about 20 nm is made by including 8-hydroxyquinoline aluminum <Alq3>, for example. The electron injection layer having a thickness of about 0.3 nm is made by including LiF or $Li_2O$, for example.

An insulating or conductive protection film 14 (specifically, including SiN, ITO, IGZO, or IZO, for example) is disposed above the second electrode 52 in order to prevent moisture from reaching the organic layer 70. Furthermore, the protective film 14 and the second substrate 12 are bonded to each other via a resin layer (sealing resin layer) 15 including an epoxy-based adhesive, for example.

In addition, the lowermost layer/interlayer insulation layer 33, the interlayer insulation layer/laminated structure 30, the organic layer 70, and the second electrode 52 are common in the plurality of light emitting elements. That is, the lowermost layer/interlayer insulation layer 33, the interlayer insulation layer/laminated structure 30, the organic layer 70, and the second electrode 52 are not patterned and are in a so-called solid film state. As described above, by forming a solid film of a light emitting layer common in all the light emitting elements without forming the light emitting layer separately for each of the light emitting elements (patterning formation), the light emitting elements can also correspond to a small and high-resolution display device having a field angle of several inches or less and a pixel pitch of several tens of micrometers or less, for example.

Each of the light emitting elements 10 has a resonator structure using the organic layer 70 as a resonance part. Note that, in order to appropriately adjust a distance from a light emitting surface to a reflecting surface (specifically, a distance from the light emitting surface to the light reflection layer 37 and the second electrode 52), the thickness of the organic layer 70 is preferably $8 \times 10^{-8}$ m or more and $5 \times 10^{-7}$ m or less, and more preferably $1.5 \times 10^{-7}$ m or more and $3.5 \times 10^{-7}$ m or less. In an organic EL display device having a resonator structure, actually, the red light emitting element 10R causes red light emitted from the light emitting layer to resonate, and emits reddish light (light having a light spectrum peak in a red region) from the second electrode 52. Furthermore, the green light emitting element 10G causes green light emitted from the light emitting layer to resonate, and emits greenish light (light having a light spectrum peak in a green region) from the second electrode 52. Furthermore, the blue light emitting element 10B causes blue light emitted from the light emitting layer to resonate, and emits blueish light (light having a light spectrum peak in a blue region) from the second electrode 52.

In Example 1, a transistor (specifically, for example, MOSFET) 20 formed on a silicon semiconductor substrate (first substrate 11) is disposed under the lower layer/interlayer insulation layer 31 (lowermost layer/interlayer insulation layer 33). In addition, the first electrode 51 is connected to the transistor 20 formed on the silicon semiconductor substrate (first substrate 11) via a contact hole (contact plug) 26 formed in the lowermost layer/interlayer insulation layer 33 and the interlayer insulation layer/laminated structure 30. Here, the transistor 20 including a MOSFET is constituted by a gate electrode 21, a gate insulation layer 22, a channel formation region 23, and a source/drain region 24. An element isolation region 25 is formed between the transistors 20, and the transistors 20 are thereby separated from each other.

Hereinafter, methods for manufacturing the light emitting element and the display device of Example 1 will be described, and the outline thereof is as follows. That is, the method for manufacturing the light emitting element includes steps of:

sequentially forming the lower layer/interlayer insulation layer 31, the light reflection layer 37 formed on the lower layer/interlayer insulation layer 31, and the upper layer/interlayer insulation layer 32 covering the lower layer/interlayer insulation layer 31 and the light reflection layer 37, and then forming the first electrode 51 on the upper layer/interlayer insulation layer 32;

subsequently forming the groove 40 in a portion of the upper layer/interlayer insulation layer 32 located in an edge region of the light emitting element 10;

then forming the insulation film 60 at least on a region of the upper layer/interlayer insulation layer 32 where the first electrode 51 is not formed so as to close an upper portion of the groove 40; and subsequently forming the organic layer 70 having a light emitting layer including an organic light emitting material over the insulation film 60 from above the first electrode 51, and forming the second electrode 52 on the organic layer 70.

Furthermore, the method for manufacturing the display device is a method for manufacturing a display device formed by arranging a plurality of pixels each constituted by the first light emitting element 10R, the second light emitting element 10G, and the third light emitting element 10B in a two-dimensional matrix, the pixels having a laminated structure in which the lowermost layer/interlayer insulation layer 33, the first interlayer insulation layer 34, the second interlayer insulation layer 35, and the uppermost layer/interlayer insulation layer 36 are sequentially laminated, the method including steps of:

forming the first light reflection layer 38R of the first light emitting element 10R on the lowermost layer/interlayer insulation layer 33;

forming the first interlayer insulation layer 34 on the lowermost layer/interlayer insulation layer 33 and the first light reflection layer 38R;

forming the second light reflection layer 38G of the second light emitting element 10G on the first interlayer insulation layer 34;

forming the second interlayer insulation layer 35 on the first interlayer insulation layer 34 and the second light reflection layer 38G;

forming the third light reflection layer 38B of the third light emitting element 10B on the second interlayer insulation layer 35;

forming the uppermost layer/interlayer insulation layer 36 on the second interlayer insulation layer 35 and the third light reflection layer 38B;

forming the first electrode 51 of each of the light emitting elements 10R, 10G, and 10B on the uppermost layer/interlayer insulation layer 36;

forming the groove 40 in a portion of the first interlayer insulation layer 34, the second interlayer insulation layer 35, and the uppermost layer/interlayer insulation layer 36 located in a boundary region among the light emitting elements 10R, 10G, and 10B;

forming the insulation film 60 at least on a region of the uppermost layer/interlayer insulation layer 36 where the first electrode 51 is not formed so as to close an upper portion of the groove 40; and in each of the light emitting elements 10R, 10G, and 10B, forming the organic layer 70 having a light emitting layer including an organic light emitting material over the insulation film 60 from above the first electrode 51, and forming the second electrode 52 on the organic layer 70.

[Step-100]

First, a light emitting element driving unit is formed on a silicon semiconductor substrate (first substrate 11) on the basis of a known MOSFET manufacturing process, and then the lowermost layer/interlayer insulation layer 33 is formed on the entire surface. Then, the first light reflection layer 38R is formed on the lowermost layer/interlayer insulation layer 33. Thereafter, the first interlayer insulation layer 34, the second light reflection layer 38G, the second interlayer insulation layer 35, the third light reflection layer 38B, and the uppermost layer/interlayer insulation layer 36 are sequentially formed. Then, a connection hole is formed on the basis of a photolithography technique and an etching technique in a portion of the lowermost layer/interlayer insulation layer 33 and the interlayer insulation layer/laminated structure 30 located above one of source/drain regions of the transistor 20. Thereafter, a metal layer is formed on the upper layer/interlayer insulation layer 32 (uppermost layer/interlayer insulation layer 36) on the basis of a sputtering method, for example. Subsequently, the metal layer is patterned on the basis of a photolithography technique and an etching technique, and the first electrode 51 can be thereby formed on the upper layer/interlayer insulation layer 32 (uppermost layer/interlayer insulation layer 36). The first electrode 51 is separated for each of the light emitting elements.

[Step-110]

Thereafter, the groove 40 is formed in a portion of the upper layer/interlayer insulation layer 32 located in an edge region of the light emitting element 10. Alternatively, the groove 40 is formed in a portion of the first interlayer insulation layer 34, the second interlayer insulation layer 35, and the uppermost layer/interlayer insulation layer 36 located in a boundary region among the light emitting elements 10R, 10G, and 10B. The groove 40 can be formed on the basis of a photolithography technique and an etching technique (for example, a RIE method). A tip of the groove 40 extends to the middle of the lower layer/interlayer insulation layer 31 (lowermost layer/interlayer insulation layer 33).

[Step-120]

Subsequently, the insulation film 60 is formed on the entire surface, for example, on the basis of a CVD method. Thereafter, an opening 61 is formed in a part of the insulation film 60 on the first electrode 51 on the basis of a photolithography technique and an etching technique. The first electrode 51 is exposed to a bottom of the opening 61. At this time, an upper portion of the groove 40 is closed with the insulation film 60.

[Step-130]

Thereafter, a film of the organic layer 70 is formed on the first electrode 51 and the insulation film 60 by a PVD method such as a vacuum vapor deposition method or a sputtering method, or a coating method such as a spin coating method or a die coating method, for example.

[Step-140]

Subsequently, the second electrode 52 is formed on the entire surface of the organic layer 70 on the basis of a vacuum vapor deposition method, for example. In this way, films of the organic layer 70 and the second electrode 52 can be continuously formed on the first electrode 51, for example, in a vacuum atmosphere. Thereafter, the protective film 14 is formed on the entire surface by a CVD method or a PVD method, for example. Finally, the protective film 14 and the second electrode 52 are bonded to each other via the resin layer (sealing resin layer) 15. Note that the color filters $CF_R$, $CF_G$, and $CF_B$, and the black matrix layer BM are formed in advance on the second substrate 12. Then, a surface on which the color filter CF is formed is used as a bonding surface. In this way, the organic EL display device illustrated in FIG. 1 can be obtained.

In the light emitting element of Example 1, a groove is formed in a portion of the upper layer/interlayer insulation layer located in an edge region of the light emitting element. Furthermore, in the display device of Example 1, a groove is formed in a portion of the first interlayer insulation layer, the second interlayer insulation layer, and the uppermost layer/interlayer insulation layer located in a boundary region among the light emitting elements. Therefore, a part of light emitted from the light emitting layer and propagated in all directions is totally reflected at an interface between the groove and the upper layer/interlayer insulation layer, or at an interface between the groove and each of the first interlayer insulation layer, the second interlayer insulation layer, and the uppermost layer/interlayer insulation layer. Therefore, a ratio of entry of light emitted from a certain light emitting element into an adjacent light emitting element can be reduced, and occurrence of a phenomenon that color mixing occurs and the chromaticity of the entire pixels is shifted from desired chromaticity can be suppressed. In addition, color mixing can be prevented. Therefore, color purity increases when monochromatic light is emitted from a pixel, and a chromaticity point is deep. Therefore, a color gamut is widened, and a range of color expression of the display device is widened. Furthermore, a color filter is disposed for each pixel in order to increase the color purity. This makes it possible to reduce the film thickness of the color filter or to omit the color filter, and makes it possible to extract light absorbed by the color filter. As a result, this leads to improvement of luminous efficiency. Furthermore, the upper portion of the groove is closed with the insulation film. Therefore, a defect such as disconnection in the second electrode is not generated in various layers and films formed above the groove.

Example 2

Figure 2:
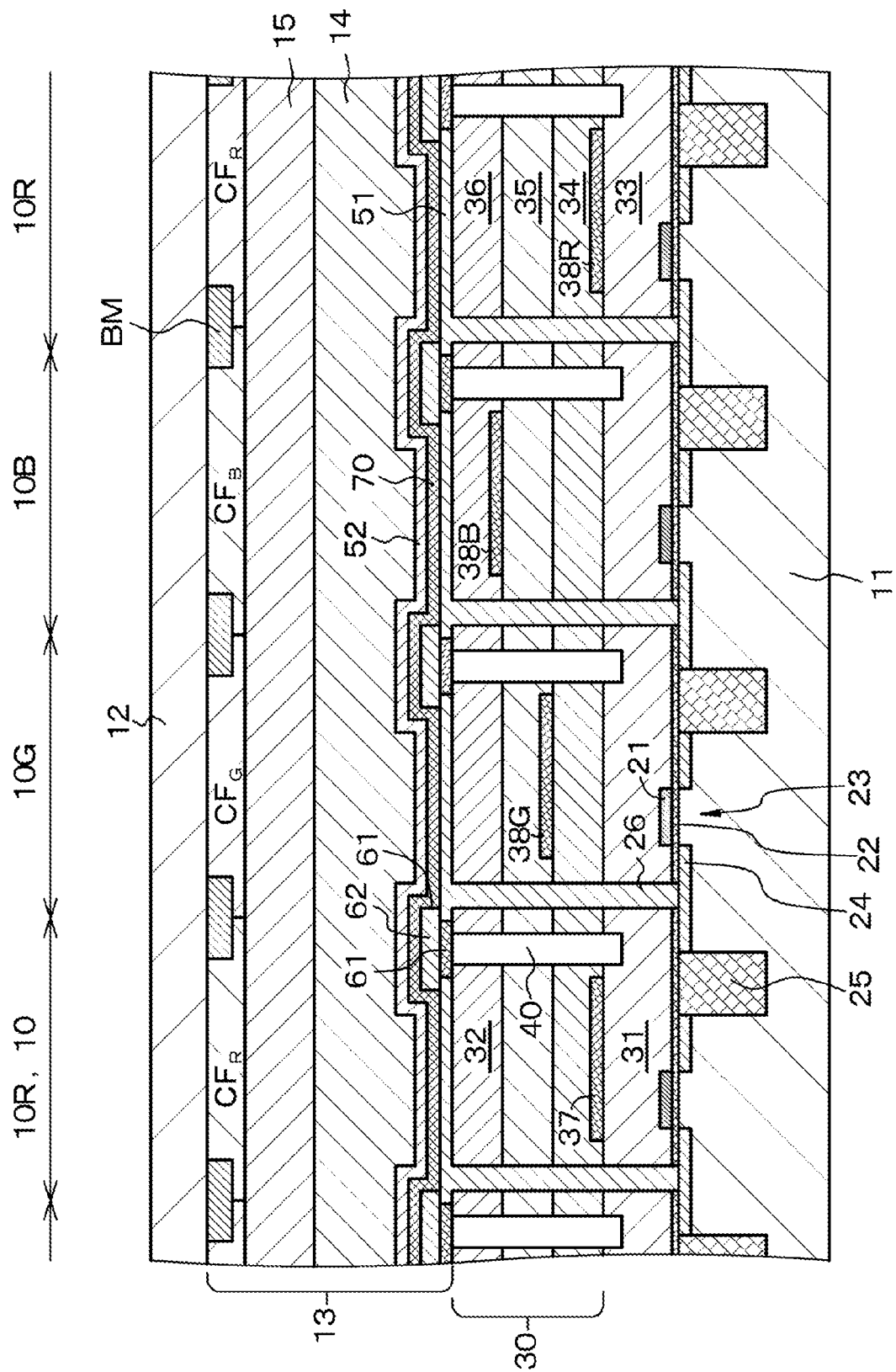
FIG. 2 is a schematic partial cross-sectional view of a display device of Example 2.

Example 2 is a modification of Example 1, and relates to the light emitting element of the configuration 1A. As illustrated in a schematic partial cross-sectional view in FIG. 2, the insulation film 60 has a two-layer structure of a first insulation film 61 including SiN or SiON and a second insulation film 62 including SiON or $SiO_2$. In addition, the first insulation film 61 is formed on a region of the upper layer/interlayer insulation layer 32 (uppermost layer/interlayer insulation layer 36) where the first electrode 51 is not formed, and the second insulation film 62 is formed over an edge of the first electrode 51 from above the first insulation film 61. The configurations and structures of the light emitting element and the display device of Example 2 can be similar to those of the light emitting element and the display device of Example 1 except for the above points, and therefore detailed description will be omitted. By forming such an insulation film having a two-layer structure, the degree of freedom in designing the insulation film is increased. Furthermore, it is necessary to form a thick insulation film in order to close an upper portion of the groove 40. However, in this case, a step is generated due to the thick insulation film between adjacent pixels, and it may be impossible to form a uniform film of the organic layer 70.

An insulation film having a two-layer structure can prevent occurrence of such a problem.

In the display device of Example 2, for example, in a similar step to [Step-120] of Example 1, by performing a flattening treatment after the first insulation film 61 is formed on the entire surface, for example, on the basis of a CVD method, it is only required to leave the first insulation film 61 on a region of the upper layer/interlayer insulation layer 32 (uppermost layer/interlayer insulation layer 36) where the first electrode 51 is not formed. At this time, an upper portion of the groove 40 is closed with the first insulation film 61. Then, it is only required to form the second insulation film 62 on the first electrode 51 and the first insulation film 61, and to form the opening 61 in a part of the second insulation film 62 on the first electrode 51 on the basis of a photolithography technique and an etching technique. The first electrode 51 is exposed to a bottom of the opening 61.

Example 3

Figure 3:
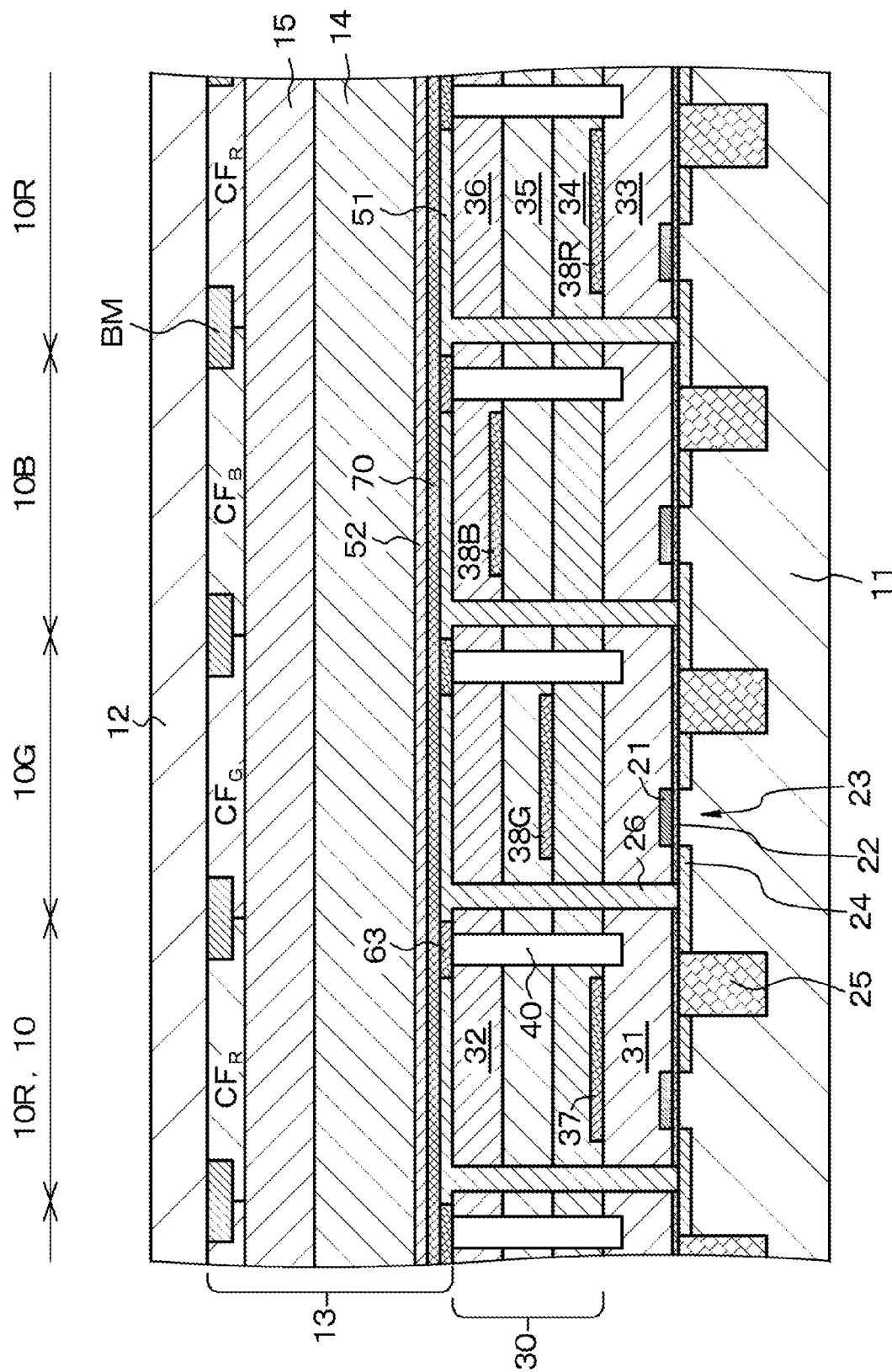
FIG. 3 is a schematic partial cross-sectional view of a display device of Example 3.

Example 3 is also a modification of Example 1, but relates to the light emitting element of the second configuration. As illustrated in a schematic partial cross-sectional view in FIG. 3, an insulation film 63 including SiON, $SiO_2$, or a polyimide resin is formed on a region of the upper layer/interlayer insulation layer 32 (uppermost layer/interlayer insulation layer 36) where the first electrode 51 is not formed. The organic layer 70 is formed on the first electrode 51 and the insulation film 63 which are flat as a whole, and the organic layer 70 is also flat. In this way, by forming the organic layer 70 on the first electrode 51 and the insulation film 63 which are flat as a whole, it is possible to prevent occurrence of a problem such as abnormal light emission at an end of an opening of the insulation film.

In the display device of Example 3, for example, in a similar step to [Step-120] of Example 1, by performing a flattening treatment after the insulation film 63 is formed on the entire surface, for example, on the basis of a CVD method, it is only required to leave the insulation film 63 on a region of the upper layer/interlayer insulation layer 32 (uppermost layer/interlayer insulation layer 36) where the first electrode 51 is not formed. At this time, an upper portion of the groove 40 is closed with the insulation film 63. The configurations and structures of the light emitting element and the display device of Example 3 can be similar to those of the light emitting element and the display device of Example 1 except for the above points, and therefore detailed description will be omitted.

Example 4

Figure 4:
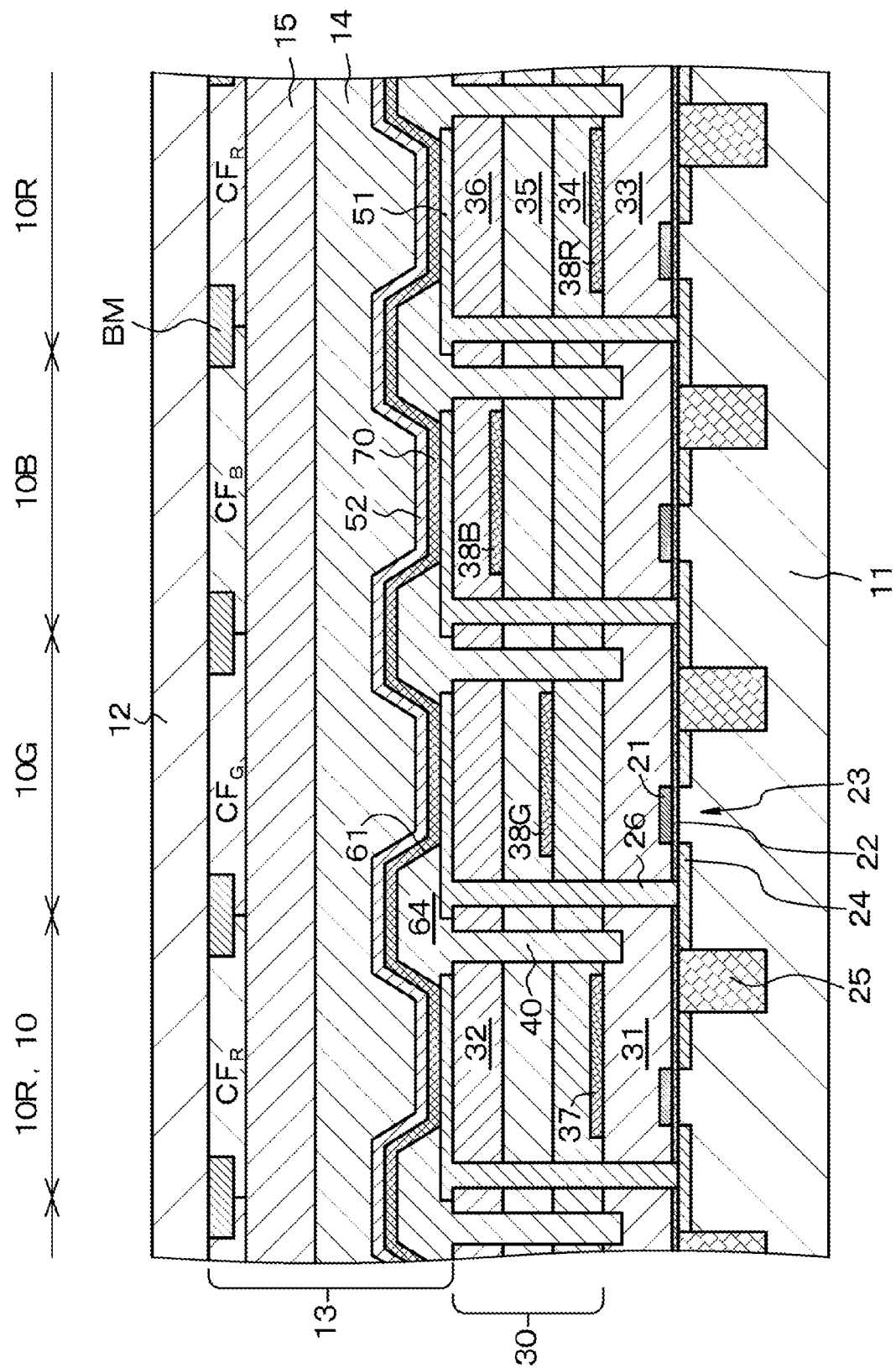
FIG. 4 is a schematic partial cross-sectional view of a display device of Example 4.
Figure 5:
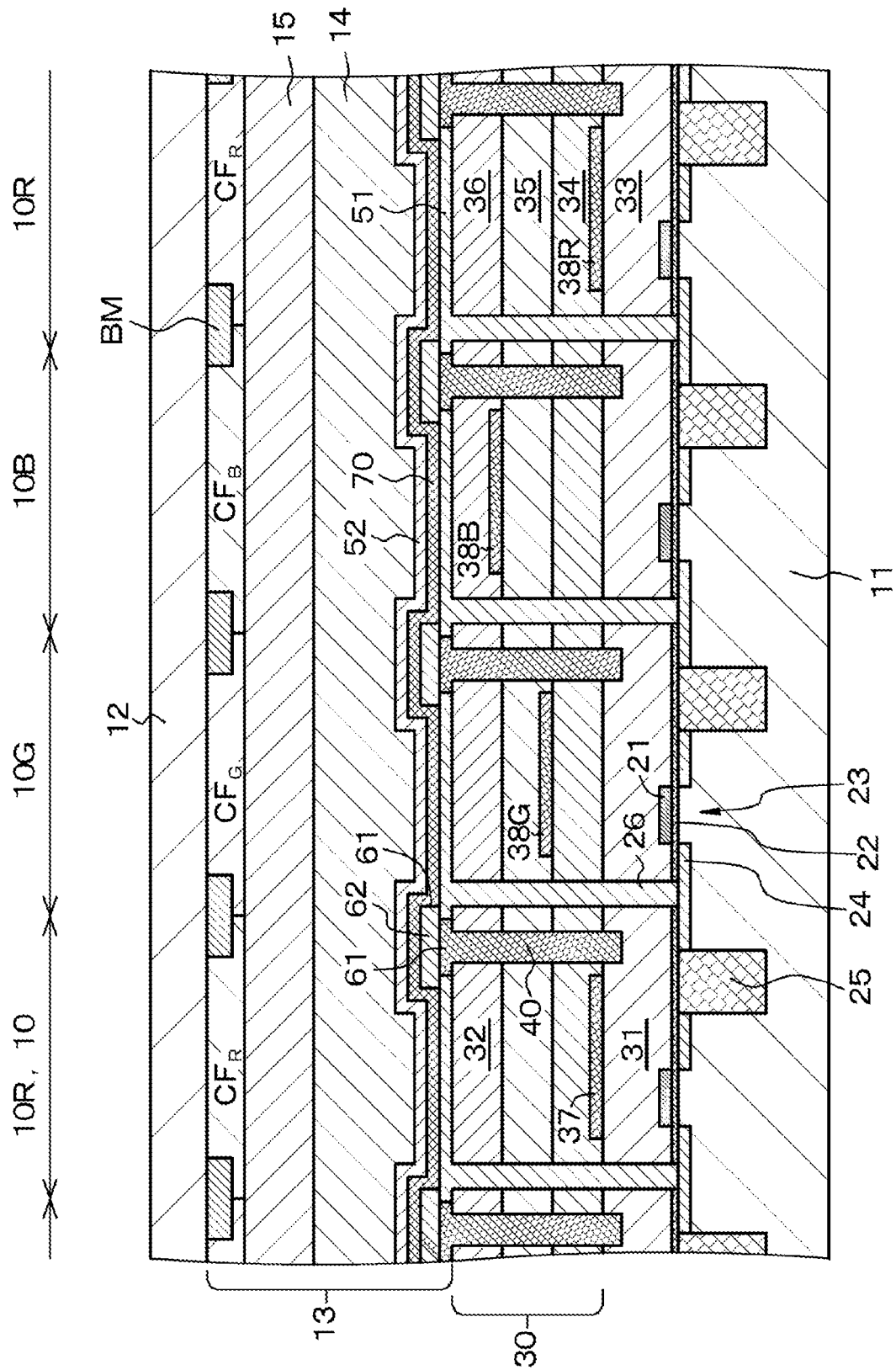
FIG. 5 is a schematic partial cross-sectional view of a modification example of the display device of Example 4.
Figure 6:
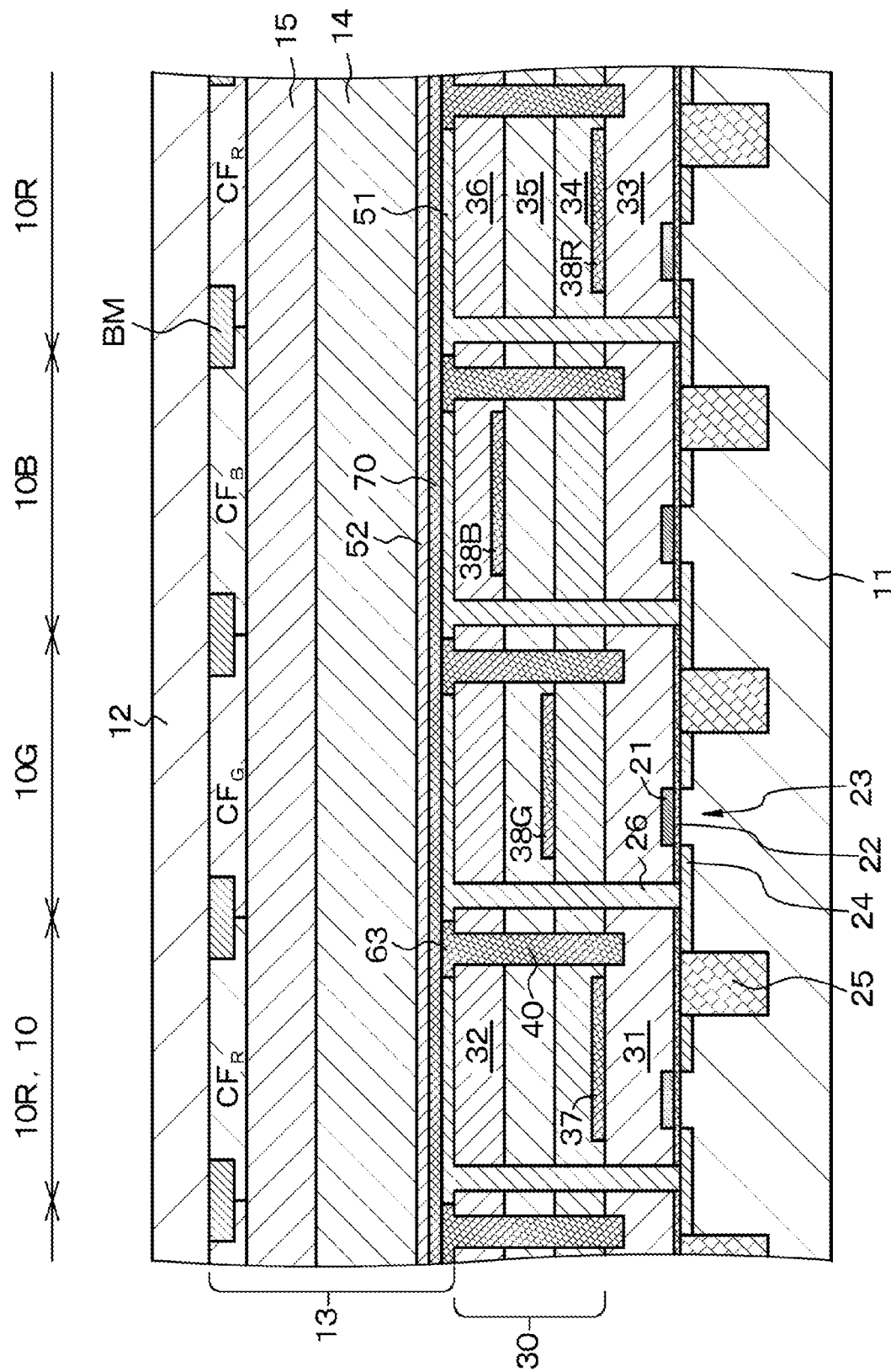
FIG. 6 is a schematic partial cross-sectional view of another modification example of the display device of Example 4.

Example 4 is a modification of Example 1, but relates to the light emitting element in the second mode and the light emitting element in the mode 2A. As illustrated in a schematic partial cross-sectional view in FIG. 4, in Example 4, a portion of the groove 40 where an upper portion is closed with an insulation film 64 is filled with a material (groove filling material) having a lower refractive index than a refractive index of a material constituting the upper layer/interlayer insulation layer 32 (uppermost layer/interlayer insulation layer 36). Specifically, the insulation film 64 extends in the groove 40. That is, the groove filling material is made by including a material constituting the insulation film 64 (specifically, a resin material such as $SiO_2$ or polyimide, for example, a so-called low-k material such as SiOC). The configurations and structures of the light emitting element and the display device of Example 4 can be similar to those of the light emitting element and the display device of Example 1 except for the above points, and therefore detailed description will be omitted. Note that the configuration of Example 4 can be applied to Example 2 (refer to FIG. 5), and can be applied to Example 3 (refer to FIG. 6).

In the display device of Example 4, for example, in a similar step to [Step-120] of Example 1, when the insulation film 64 is formed on the entire surface, for example, on the basis of a coating method, it is only required to pour a material constituting the insulation film 64 into the groove 40.

Example 5

Figure 7:
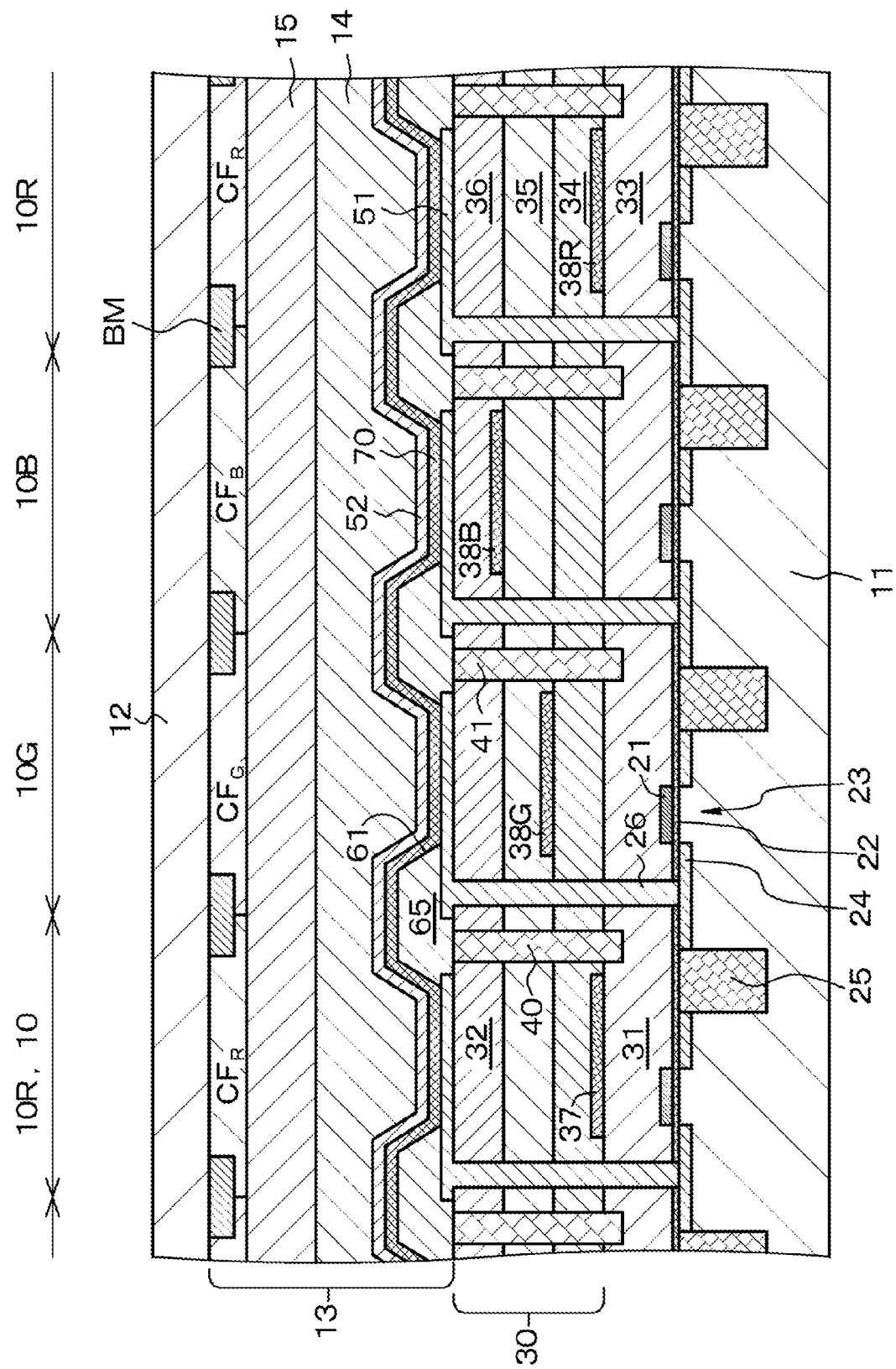
FIG. 7 is a schematic partial cross-sectional view of a display device of Example 5.
Figure 8:
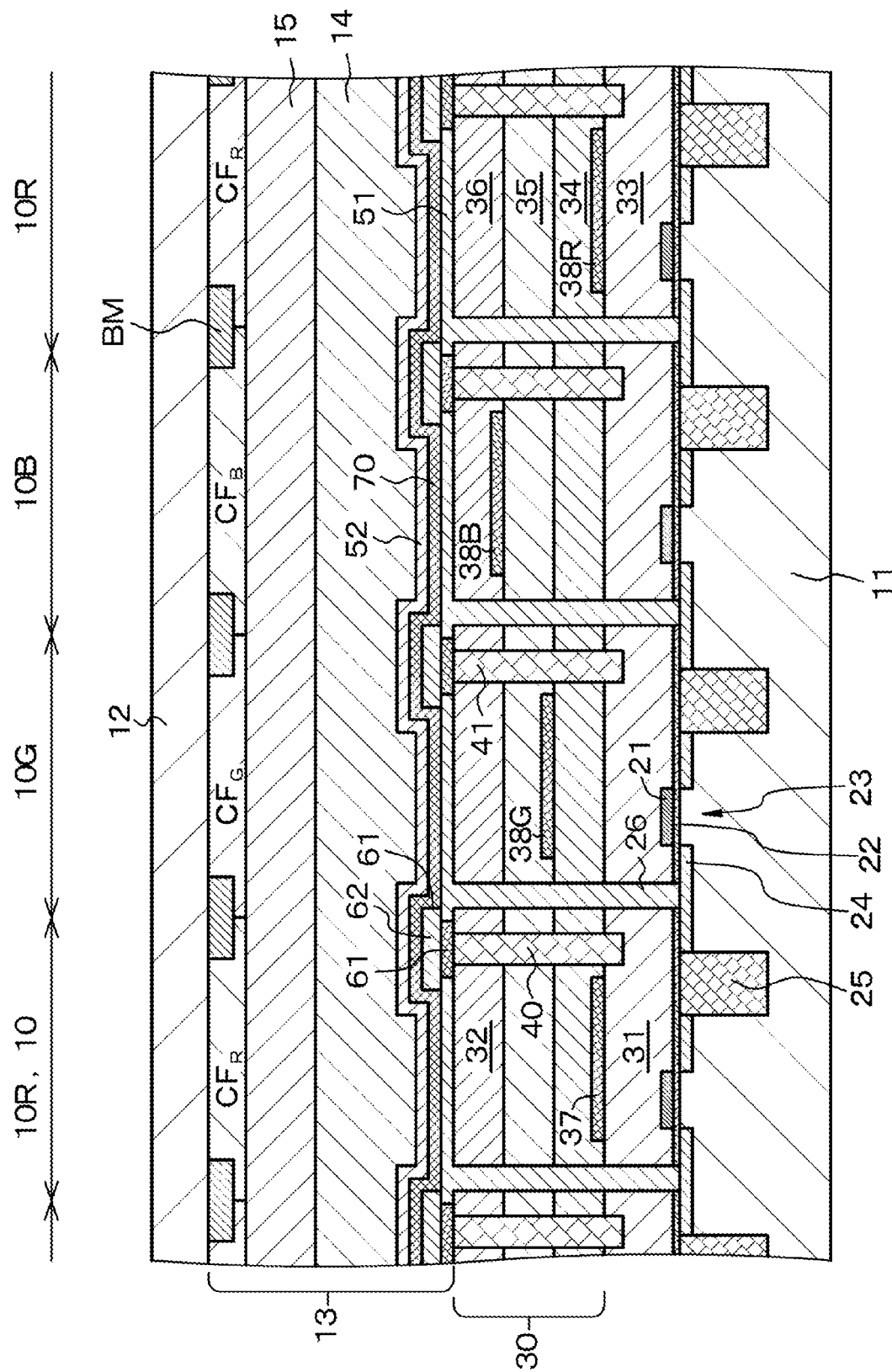
FIG. 8 is a schematic partial cross-sectional view of a modification example of the display device of Example 5.
Figure 9:
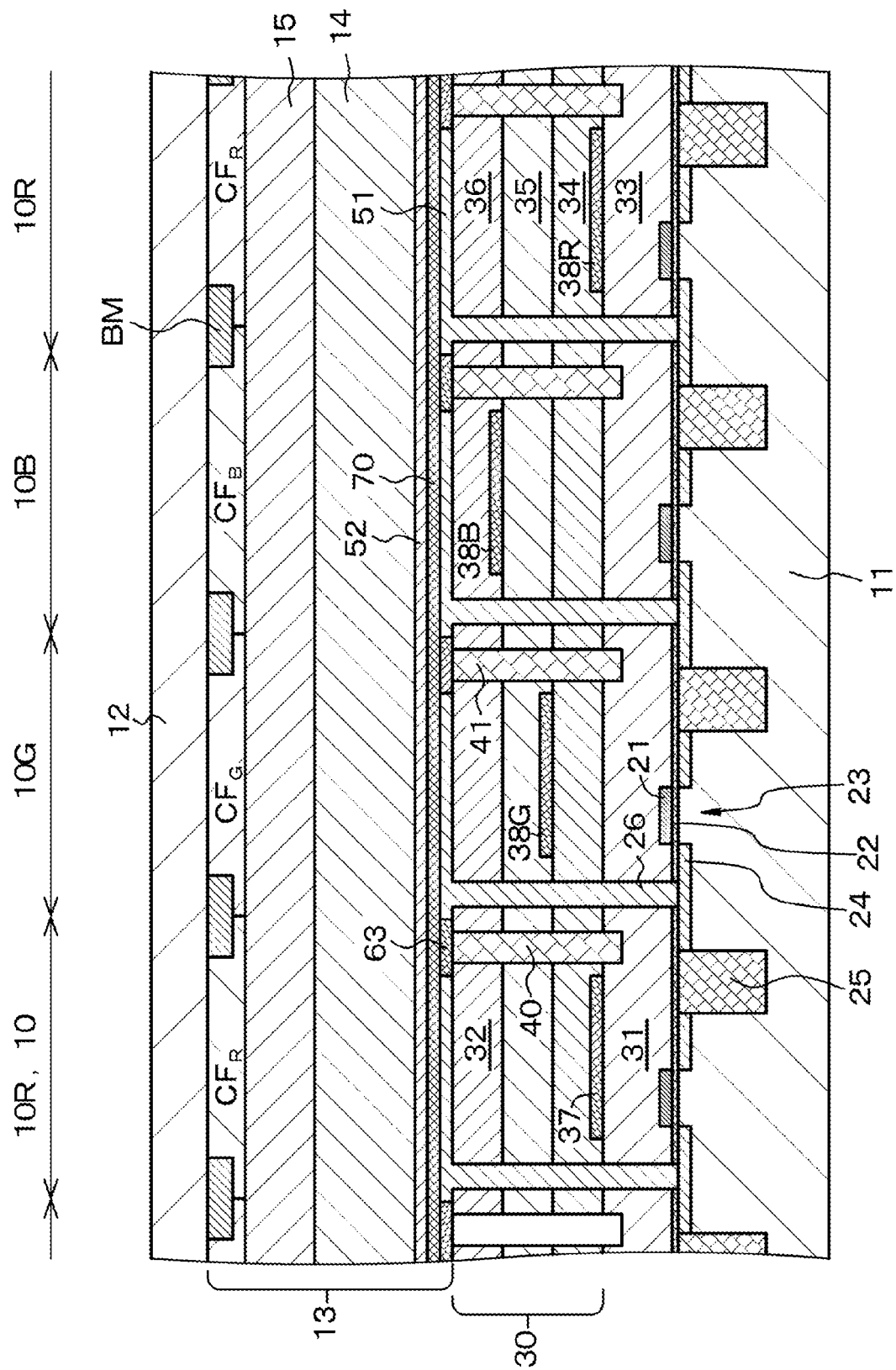
FIG. 9 is a schematic partial cross-sectional view of another modification example of the display device of Example 5.

Example 5 is a modification of Example 4, and relates to the light emitting element in the mode 2B. As illustrated in a schematic partial cross-sectional view in FIG. 7, in Example 5, a material with which the groove 40 is filled (groove filling material 41) is different from a material constituting an insulation film 65. When a refractive index of a material constituting the insulation film 65 is represented by $n_{INS}$, a refractive index of a material constituting the upper layer/interlayer insulation layer 32 is represented by $n_{UP}$ (alternatively, an average refractive index of the interlayer insulation layer/laminated structure 30 is represented by $n_{UP}$), and a refractive index of a material with which the groove 40 is filled (groove filling material 41) is represented by $n_{SLIT}$, $n_{UP} > n_{SLIT}$ and $n_{UP} > n_{INS}$ are satisfied. Specifically, although not limited, $1.0 \leq n_{UP} \times n_{SLIT} \leq 1.7$ and
$0.5 \leq n_{UP} - n_{INS} \leq 1.0$ can be exemplified. More specifically, the groove filling material 41: porous SiOC (refractive index $n_{SLIT}$: 1.2) is used. The configurations and structures of the light emitting element and the display device of Example 5 can be similar to those of the light emitting element and the display device of Example 4 except for the above points, and therefore detailed description will be omitted. Note that the configuration of Example 5 can be applied to Example 2 (refer to FIG. 8), and can be applied to Example 3 (refer to FIG. 9).

In the display device of Example 5, for example, after a similar step to [Step-110] of Example 1, it is only required to fill the groove 40 with the groove filling material 41 on the basis of a spin coating method.

Example 6

Figure 10:
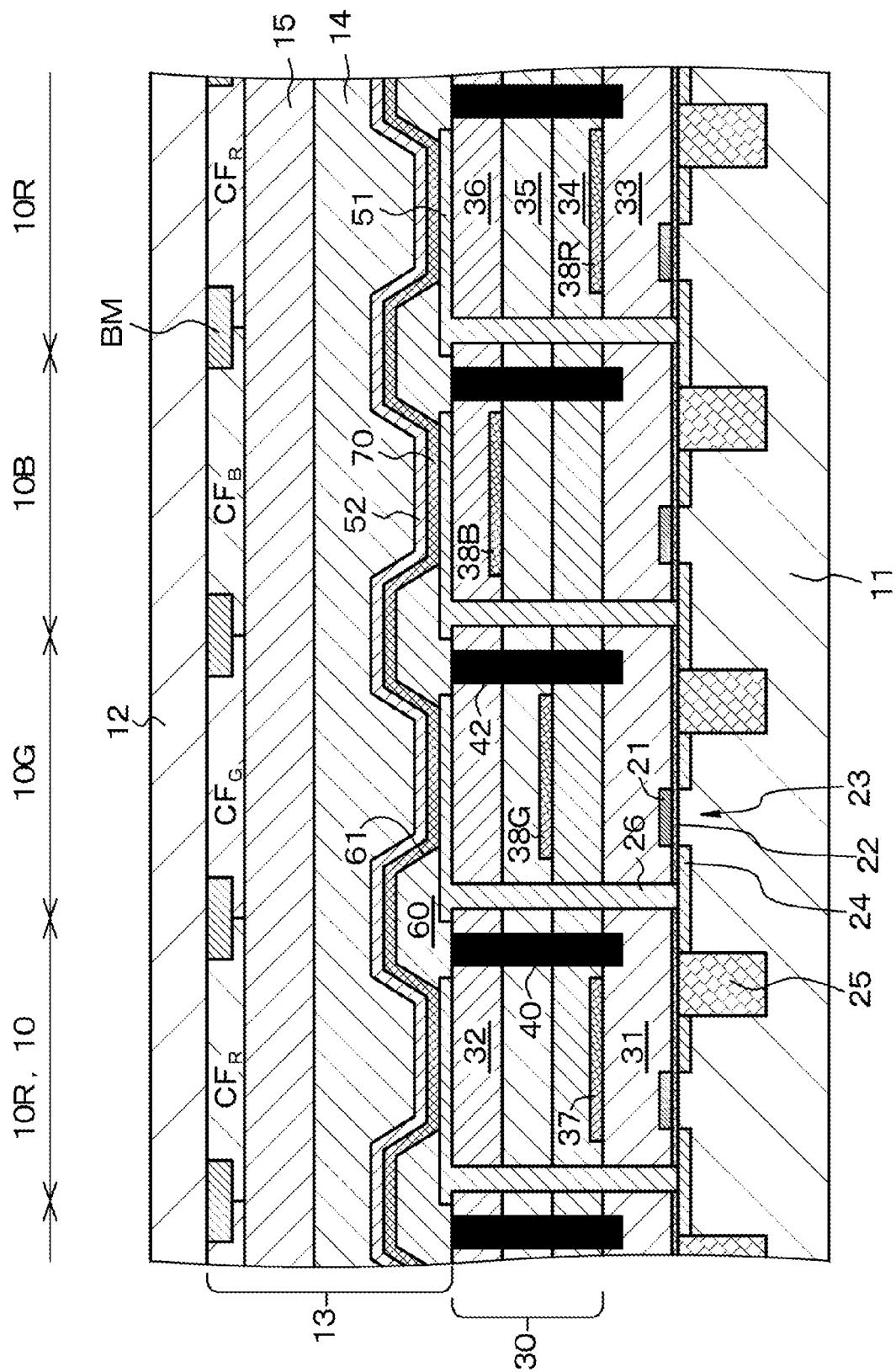
FIG. 10 is a schematic partial cross-sectional view of a display device of Example 6.

Example 6 is a modification of Example 1, but relates to the light emitting element in the third mode. As illustrated in a schematic partial cross-sectional view in FIG. 10, in the display device of Example 6, a portion of the groove 40 where an upper portion is closed with the insulation film 60 is filled with a light shielding material 42. Specifically, the light shielding material 42 is made by including tungsten (W). The configurations and structures of the light emitting element and the display device of Example 6 can be similar to those of the light emitting element and the display device of Example 4 except for the above points, and therefore detailed description will be omitted.

Figure 11:
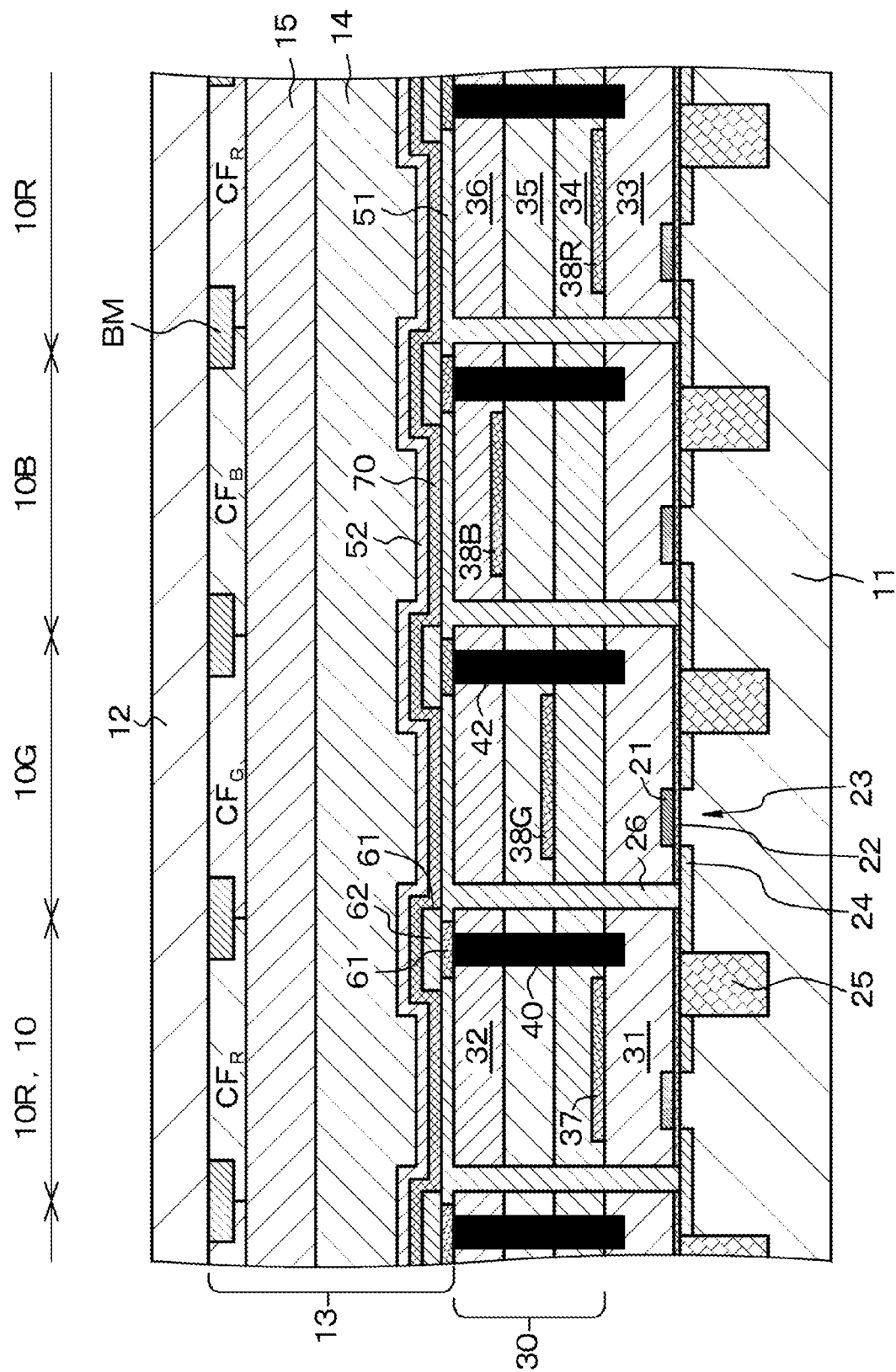
FIG. 11 is a schematic partial cross-sectional view of a modification example of the display device of Example 6.
Figure 12:
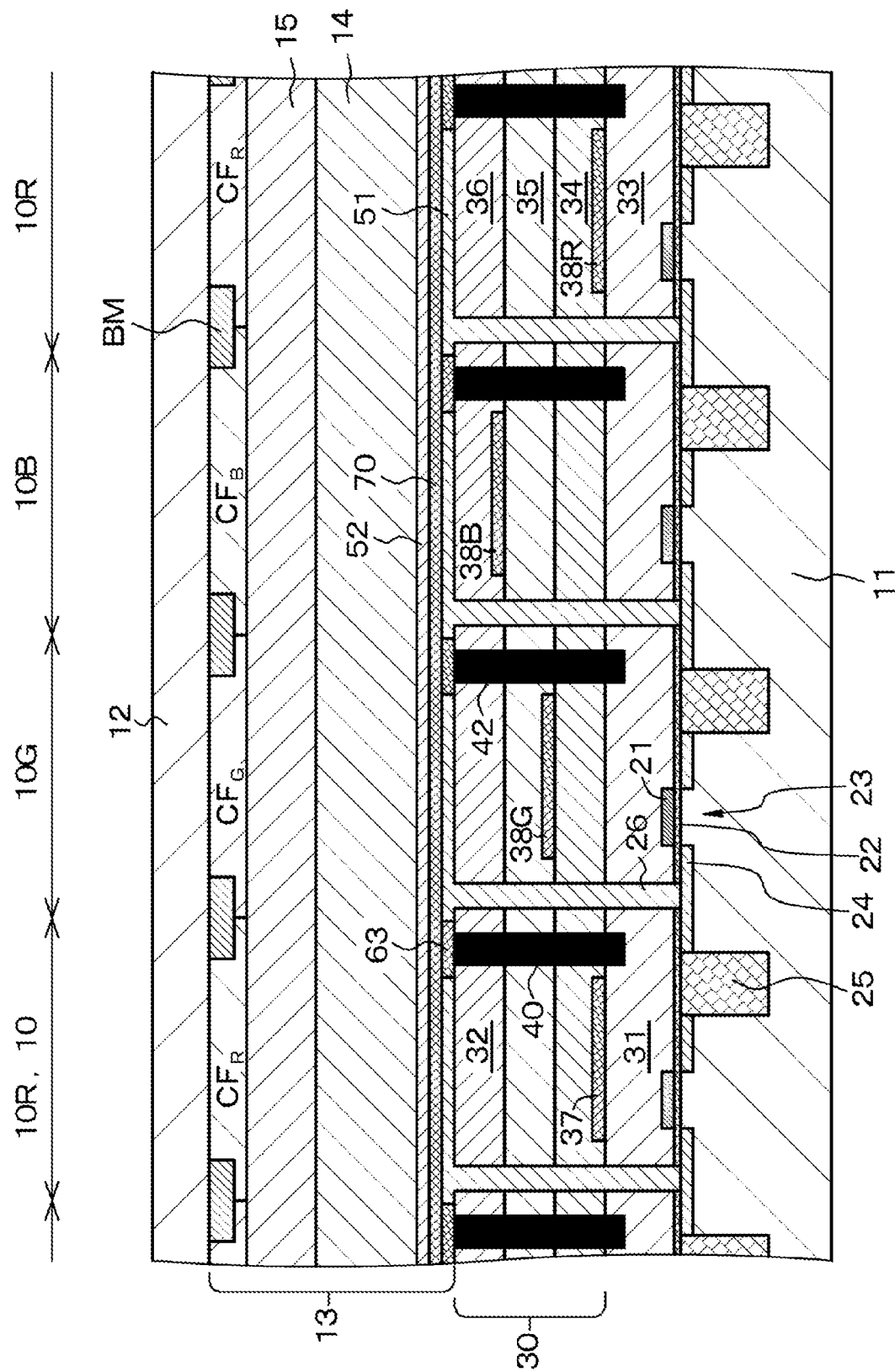
FIG. 12 is a schematic partial cross-sectional view of another modification example of the display device of Example 6.

In the display device of Example 6, for example, after a similar step to [Step-110] of Example 1, it is only required to fill the groove 40 with the light shielding member 42 on the basis of a CVD method. Alternatively, the groove 40 may be filled simultaneously with formation of the contact hole 26. Note that the configuration of Example 6 can be applied to Example 2 (refer to FIG. 11), and can be applied to Example 3 (refer to FIG. 12).

Example 7

Example 7 is a modification of Examples 1 to 6.

By the way, a phenomenon that a leakage current flows between the first electrode in a certain light emitting element and the second electrode constituting an adjacent light emitting element may occur. In addition, when such a phenomenon occurs, light emission occurs in a light emitting element which should not emit light originally. Meanwhile, intensity of an electric field in a light emitting element which should emit light is reduced. As a result, blurring may occur in an image, or the chromaticity of the entire pixels may be shifted from desired chromaticity. In order to solve such a problem, in Example 7, at the time of film formation of the organic layer 70, at least a part of a part (specifically, for example, hole injection layer) of the organic layer 70 is made discontinuous at an end of the insulation film 60, specifically, at an edge of the opening 61 disposed in the insulation film 60. In this way, for example, by making at least a part of a hole injection layer discontinuous, the resistance of the hole injection layer is increased, and occurrence of a phenomenon that a leakage current flows between the first electrode in a certain light emitting element and the second electrode constituting an adjacent light emitting element can be reliably prevented.

In order to make at least a part of the hole injection layer discontinuous, it is only required to optimize an inclination state of an edge of the opening 61 disposed in the insulation film 60, and to optimize film formation conditions of the hole injection layer. Alternatively, for example, in the display device described in Example 2, it is only required to form a third insulation film having an end (eaves-like end) protruding into the opening 61 on the second insulation film 62, and to make at least a part of the hole injection layer discontinuous at a protruding end of the third insulation film.

Alternatively, after [Step-100] of Example 1, a kind of sacrificial layer is formed on the entire surface, and then the groove 40 is formed in a similar manner to [Step-110] of Example 1. Subsequently, the insulation film 60 is formed, and the opening 61 is formed in a part of the insulation film 60 in a similar manner to [Step-120] of Example 1. The sacrificial layer is exposed to a bottom of the opening 61. The sacrificial layer formed in a portion of the uppermost layer/interlayer insulation layer 36 located between the first electrode 51 and the first electrode 51 is covered with the insulation film 60. Then, the exposed sacrificial layer is removed at the bottom of the opening 61. A gap is generated between the first electrode 51 and the portion of the insulation film 60 located above the first electrode 51 due to removal of the sacrificial layer. That is, the portion of the insulation film 60 located above the first electrode 51 has a kind of eaves-like shape. Therefore, by forming a hole injection layer in this state, at least a part of the hole injection layer can be made discontinuous.

Hitherto, the present disclosure has been described on the basis of the preferable Examples. However, the present disclosure is not limited to these Examples. The configurations and structures of the display device, the organic EL display device, the light emitting element, and the organic EL element described in Examples are illustrative and can be changed appropriately. In Examples, one pixel is constituted exclusively by three sub-pixels using a combination of a white light emitting element and a color filter. However, for example, one pixel may be constituted by four sub-pixels obtained by adding a light emitting element that emits white light.

Note that the present disclosure may have the following configurations.

[A01]<<Light Emitting Element>>

A light emitting element including:
a lower layer/interlayer insulation layer;
a light reflection layer formed on the lower layer/interlayer insulation layer;
an upper layer/interlayer insulation layer covering the lower layer/interlayer insulation layer and the light reflection layer;
a first electrode formed on the upper layer/interlayer insulation layer;
an insulation film formed at least on a region of the upper layer/interlayer insulation layer where the first electrode is not formed;
an organic layer formed over the insulation film from above the first electrode, the organic layer having a light emitting layer including an organic light emitting material; and
a second electrode formed on the organic layer, in which
a groove is formed in a portion of the upper layer/interlayer insulation layer located in an edge region of the light emitting element, and
an upper portion of the groove is closed with the insulation film.

[A02]<<Light Emitting Element in First Mode>>

The light emitting element according to [A01], in which the portion of the groove where an upper portion is closed with the insulation film is filled with air or in a vacuum state.

[A03] The light emitting element according to [A02], in which
when a refractive index of a material constituting the insulation film is represented by $n_{INS}$ and a refractive index of a material constituting the upper layer/interlayer insulation layer is represented by $n_{UP}$,
$n_{UP} > n_{INS}$ is satisfied.

[A04]<<Light Emitting Element in Second Mode>>

The light emitting element according to [A01], in which the portion of the groove where an upper portion is closed with the insulation film is filled with a material having a lower refractive index than a refractive index of a material constituting the upper layer/interlayer insulation layer.

[A05]<<Light Emitting Element in Mode 2A>>

The light emitting element according to [A04], in which the insulation film extends in the groove.

[A06]<<Light Emitting Element in Mode 2B>>

The light emitting element according to [A04], in which a material with which the groove is filled and a material constituting the insulation film are different from each other.

[A07] The light emitting element according to [A06], in which
when a refractive index of a material constituting the insulation film is represented by $n_{INS}$, a refractive index of a material constituting the upper layer/interlayer insulation layer is represented by $n_{UP}$, and a refractive index of a material with which the groove is filled is represented by $n_{SLIT}$, $n_{UP} > n_{SLIT}$ and $n_{UP} > n_{INS}$ are satisfied.

[A08]<<Light Emitting Element in Third Mode>>

The light emitting element according to [A01], in which the portion of the groove where an upper portion is closed with the insulation film is filled with a light shielding material.

[A09]<<Light Emitting Element of First Configuration>>

The light emitting element according to any one of [A01] to [A08], in which the insulation film extends to a top surface of an edge of the first electrode.

[A10]<<Light Emitting Element of Configuration 1A>>

The light emitting element according to [A09], in which
the insulation film has a two-layer structure of a first insulation film and a second insulation film,
the first insulation film is formed on a region of the upper layer/interlayer insulation layer where the first electrode is not formed, and
the second insulation film is formed over an edge of the first electrode from above the first insulation film.

[A11]<<Light Emitting Element of Second Configuration>>

The light emitting element according to any one of [A01] to [A08], in which the insulation film is formed on a region of the upper layer/interlayer insulation layer where the first electrode is not formed.

[A12] The light emitting element according to any one of [A01] to [A11], in which a tip of the groove extends to the lower layer/interlayer insulation layer.

[B01]<<Display Device>>

A display device formed by arranging a plurality of pixels each constituted by a first light emitting element, a second light emitting element, and a third light emitting element in a two-dimensional matrix, in which
the pixels have a laminated structure in which a lowermost layer/interlayer insulation layer, a first interlayer insulation layer, a second interlayer insulation layer, and an uppermost layer/interlayer insulation layer are sequentially laminated,
each of the light emitting elements includes:
a first electrode formed on the uppermost layer/interlayer insulation layer;
an insulation film formed at least on a region of the uppermost layer/interlayer insulation layer where the first electrode is not formed;
an organic layer formed over the insulation film from above the first electrode, the organic layer having a light emitting layer including an organic light emitting material; and
a second electrode formed on the organic layer,
the first light emitting element includes a first light reflection layer formed between the lowermost layer/interlayer insulation layer and the first interlayer insulation layer,
the second light emitting element includes a second light reflection layer formed between the first interlayer insulation layer and the second interlayer insulation layer,
the third light emitting element includes a third light reflection layer formed between the second interlayer insulation layer and the uppermost layer/interlayer insulation layer,
a groove is formed in a portion of the first interlayer insulation layer, the second interlayer insulation layer, and the uppermost layer/interlayer insulation layer located in a boundary region among the light emitting elements, and
an upper portion of the groove is closed with the insulation film.

[B02] The display device according to [B01], in which, in each of the light emitting elements, the portion of the groove where an upper portion is closed with the insulation film is filled with air or in a vacuum state.

[B03] The display device according to [B02], in which
when a refractive index of a material constituting the insulation film is nets and an average refractive index of the first interlayer insulation layer, the second interlayer insulation layer, and the uppermost layer/interlayer insulation layer is represented by $n_{UP}$,
$n_{UP} > n_{INS}$ is satisfied.

[B04] The display device according to [B01], in which, in each of the light emitting elements, the portion of the groove where an upper portion is closed with the insulation film is filled with a material having a lower refractive index than an average refractive index of the first interlayer insulation layer, the second interlayer insulation layer, and the uppermost layer/interlayer insulation layer.

[B05] The display device according to [B04], in which, in each of the light emitting elements, the insulation film extends in the groove.

[B06] The display device according to [B04], in which a material with which the groove is filled and a material constituting the insulation film are different from each other.

[B07] The display device according to [B06], in which
when a refractive index of a material constituting the insulation film is represented by $n_{INS}$, an average refractive index of the first interlayer insulation layer, the second interlayer insulation layer, and the uppermost layer/interlayer insulation layer is represented by $n_{UP}$, and a refractive index of a material with which the groove is filled is represented by $n_{SLIT}$,
$n_{UP} > n_{SLIT}$ and
$n_{UP} > n_{INS}$
are satisfied.

[B08] The display device according to [B01], in which, in each of the light emitting elements, the portion of the groove where an upper portion is closed with the insulation film is filled with a light shielding material.

[B09] The display device according to any one of [B01] to [B08], in which, in each of the light emitting elements, the insulation film extends to a top surface of an edge of the first electrode.

[B10] The display device according to [B09], in which,
in each of the light emitting elements,
the insulation film has a two-layer structure of a first insulation film and a second insulation film,
the first insulation film is formed on a region of the uppermost layer/interlayer insulation layer where the first electrode is not formed, and
the second insulation film is formed over an edge of the first electrode from above the first insulation film.

[B11] The display device according to any one of [B01] to [B08], in which, in each of the light emitting elements, the insulation film is formed on a region of the uppermost layer/interlayer insulation layer where the first electrode is not formed.

[B12] The display device according to any one of [B01] to [B11], in which, in each of the light emitting elements, a tip of the groove extends to the lower layer/interlayer insulation layer.

[C01]<<Method for Manufacturing Light Emitting Element>>

A method for manufacturing a light emitting element, including steps of:
sequentially forming a lower layer/interlayer insulation layer, a light reflection layer formed on the lower layer/interlayer insulation layer, and an upper layer/interlayer insulation layer covering the lower layer/interlayer insulation layer and the light reflection layer, and then forming a first electrode on the upper layer/interlayer insulation layer;

subsequently forming a groove in a portion of the upper layer/interlayer insulation layer located in an edge region of a light emitting element;

then forming an insulation film at least on a region of the upper layer/interlayer insulation layer where the first electrode is not formed so as to close an upper portion of the groove; and subsequently forming an organic layer having a light emitting layer including an organic light emitting material over the insulation film from above the first electrode, and forming a second electrode on the organic layer.

[C02] The method for manufacturing a light emitting element according to [C01], in which the portion of the groove where an upper portion is closed with the insulation film is filled with air or in a vacuum state.

[C03] The method for manufacturing a light emitting element according to [C02], in which when a refractive index of a material constituting the insulation film is represented by $n_{INS}$ and a refractive index of a material constituting the upper layer/interlayer insulation layer is represented by $n_{UP}$, $n_{UP} > n_{INS}$ is satisfied.

[C04] The method for manufacturing a light emitting element according to [C01], in which the portion of the groove where an upper portion is closed with the insulation film is filled with a material having a lower refractive index than a refractive index of a material constituting the upper layer/interlayer insulation layer.

[C05] The method for manufacturing a light emitting element according to [C04], in which the insulation film extends in the groove.

[C06] The method for manufacturing a light emitting element according to [C04], in which a material with which the groove is filled and a material constituting the insulation film are different from each other.

[C07] The method for manufacturing a light emitting element according to [C06], in which when a refractive index of a material constituting the insulation film is represented by $n_{INS}$, a refractive index of a material constituting the upper layer/interlayer insulation layer is represented by $n_{UP}$, and a refractive index of a material with which the groove is filled is represented by $n_{SLIT}$, $n_{UP} > n_{SLIT}$ and $n_{UP} > n_{INS}$ are satisfied.

[C08] The method for manufacturing a light emitting element according to [C01], in which the portion of the groove where an upper portion is closed with the insulation film is filled with a light shielding material.

[C09] The method for manufacturing a light emitting element according to any one of [C01] to [C08], in which the insulation film extends to a top surface of an edge of the first electrode.

[C10] The method for manufacturing a light emitting element according to [C09], in which the insulation film has a two-layer structure of a first insulation film and a second insulation film, the first insulation film is formed on a region of the upper layer/interlayer insulation layer where the first electrode is not formed, and the second insulation film is formed over an edge of the first electrode from above the first insulation film.

[C11] The method for manufacturing a light emitting element according to any one of [C01] to [C08], in which the insulation film is formed on a region of the upper layer/interlayer insulation layer where the first electrode is not formed.

[C12] The method for manufacturing a light emitting element according to any one of [C01] to [C11], in which a tip of the groove extends to the lower layer/interlayer insulation layer.

[D01]<<Method for Manufacturing Display Device>>

A method for manufacturing a display device formed by arranging a plurality of pixels each constituted by a first light emitting element, a second light emitting element, and a third light emitting element in a two-dimensional matrix, the pixels having a laminated structure in which a lowermost layer/interlayer insulation layer, a first interlayer insulation layer, a second interlayer insulation layer, and an uppermost layer/interlayer insulation layer are sequentially laminated, the method including steps of:

forming a first light reflection layer of the first light emitting element on the lowermost layer/interlayer insulation layer;

forming the first interlayer insulation layer on the lowermost layer/interlayer insulation layer and the first light reflection layer;

forming a second light reflection layer of the second light emitting element on the first interlayer insulation layer;

forming the second interlayer insulation layer on the first interlayer insulation layer and the second light reflection layer;

forming a third light reflection layer of the third light emitting element on the second interlayer insulation layer;

forming the uppermost layer/interlayer insulation layer on the second interlayer insulation layer and the third light reflection layer;

forming a first electrode of each of the light emitting elements on the uppermost layer/interlayer insulation layer;

forming a groove in a portion of the first interlayer insulation layer, the second interlayer insulation layer, and the uppermost layer/interlayer insulation layer located in a boundary region among the light emitting elements;

forming an insulation film at least on a region of the uppermost layer/interlayer insulation layer where the first electrode is not formed so as to close an upper portion of the groove; and in each of the light emitting elements, forming an organic layer having a light emitting layer including an organic light emitting material over the insulation film from above the first electrode, and forming a second electrode on the organic layer.

REFERENCE SIGNS LIST

10 Light emitting element
10R First light emitting element (red light emitting element)
10G Second light emitting element (green light emitting element)
10B Third light emitting element (blue light emitting element)
11 First substrate
12 Second substrate 13 Image display unit
14 Protective film
15 Resin layer (sealing resin layer)
CF, $CF_R$, $CF_G$, $CF_B$ Color filter
BM Black matrix layer
20 Transistor
21 Gate electrode
22 Gate insulation layer
23 Channel formation region
24 Source/drain region
25 Element isolation region
26 Contact hole (contact plug)
30 Interlayer insulation layer/laminated structure
31 Lower layer/interlayer insulation layer (lowermost layer/interlayer insulation layer)
35 Upper layer/interlayer insulation layer
31 Lower layer/interlayer insulation layer (lowermost layer/interlayer insulation layer)
32 First interlayer insulation layer
33 Second interlayer insulation layer
35 Uppermost layer/interlayer insulation layer
37 Light reflection layer
38R First light reflection layer
38G Second light reflection layer
38B Third light reflection layer
40 Groove
41 Groove filling material
42 Light shielding material
51 First electrode
52 Second electrode
60, 63, 64, 65 Insulation film
61 First insulation film
62 Second insulation film
70 Organic layer

The invention claimed is:

1. A display device comprising:
a substrate;
a plurality of transistors arranged on the substrate;
a first insulating film disposed over the plurality of transistors;
a plurality of light emitting elements including a first light emitting element, a second light emitting element and a third light emitting element, the plurality of light emitting elements being arranged on the first insulating film; and
a color filter comprising a red region corresponding to the first light emitting element, a green region corresponding to the second light emitting element and a blue region corresponding to the third light emitting element, the color filter being disposed along a light emission direction, wherein
the first, second, and third light emitting elements respectively include a light reflection layer, an anode electrode, a light emitting layer and a light transparent layer, the light emitting layers of the first, second, and third light emitting elements extending throughout the plurality of light emitting elements,
in the first light emitting element, a first distance is a distance between a top surface of the light reflection layer between a bottom surface of the cathode electrode, in the second light emission element, a second distance is a distance between a top surface of the light reflection layer and a bottom surface of the cathode electrode, in the third light emission element, a third distance is a distance between a top surface of the light reflection layer between a bottom surface of the cathode electrode, the first distance, the second distance and the third distance being different from each other, and
a first groove is located between two of the plurality of light emitting elements.

2. The display device according to claim 1, wherein the first groove is contact with the first insulating film.

3. The display device according to claim 1, wherein a light shielding member is located in the first groove.

4. The display device according to claim 1, wherein the two of the plurality of light emitting elements are adjacent to each other.

5. The display device according to claim 1, wherein the first groove is located between the first light emitting element and the second light emitting element.

6. The display device according to claim 5, wherein a second groove is located between the second light emitting element and the third light emitting element, and the second groove is configured to reflect light emitted from the second light emitting element and the third light emitting element.

7. The display device according to claim 1, wherein
the plurality of light emitting elements further comprises a fourth light emitting element, and
the color filter further comprises a transparent region corresponding to the fourth light emitting element.

8. The display device according to claim 1, wherein each of the plurality of light emitting elements is configured to emit white light.

9. The display device according to claim 1, wherein the light transparent layer is located between the light reflection layer and the color filter.

10. The display device according to claim 1, wherein the light reflection layer is a metal layer.

11. The display device according to claim 1, wherein a second insulating film is located between the two of the plurality of light emitting elements.

12. The display device according to claim 11, wherein the first groove is overlapped with the second insulating film between the two of the plurality of light emitting elements, in a cross sectional view.

* * * * *